(12) United States Patent
Sato et al.

(10) Patent No.: US 11,594,458 B2
(45) Date of Patent: Feb. 28, 2023

(54) CURABLE RESIN FILM AND FIRST PROTECTIVE FILM FORMING SHEET

(71) Applicant: LINTEC Corporation, Tokyo (JP)

(72) Inventors: Akinori Sato, Saitama (JP); Masanori Yamagishi, Phoenix, AZ (US)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 16/460,280

(22) Filed: Jul. 2, 2019

(65) Prior Publication Data

US 2019/0330465 A1    Oct. 31, 2019

Related U.S. Application Data

(63) Continuation of application No. 15/770,529, filed as application No. PCT/JP2016/082539 on Nov. 2, 2016, now abandoned.

(30) Foreign Application Priority Data

Nov. 4, 2015    (JP) .............................. JP2015-217108

(51) Int. Cl.
  *H01L 21/56*    (2006.01)
  *H01L 23/31*    (2006.01)
  (Continued)

(52) U.S. Cl.
  CPC .......... *H01L 23/3171* (2013.01); *B32B 27/08* (2013.01); *B32B 27/308* (2013.01); *B32B 27/32* (2013.01); *B32B 27/36* (2013.01); *B32B 27/38* (2013.01); *C08L 33/08* (2013.01); *C08L 63/00* (2013.01); *C09J 7/385* (2018.01);
  (Continued)

(58) Field of Classification Search
  CPC ............................................. H01L 2224/03436
  See application file for complete search history.

(56) References Cited

U.S. PATENT DOCUMENTS

| 2001/0003049 A1* | 6/2001 | Fukasawa | ........... H01L 23/3107 438/127 |
| 2004/0009631 A1* | 1/2004 | Connell | ................ H01L 21/561 257/E23.129 |

(Continued)

FOREIGN PATENT DOCUMENTS

| JP | 2005-028734 | 2/2005 |
| JP | 2006-303119 | * 11/2006 |

(Continued)

OTHER PUBLICATIONS

Machine translation of Document N.*

(Continued)

*Primary Examiner* — Austin Murata
(74) *Attorney, Agent, or Firm* — Nixon & Vanderhye P.C.

(57) ABSTRACT

This curable resin film forms a first protective film on a surface having bumps of a semiconductor wafer by being attached to the surface and being cured, in which a cured material of the curable resin film has a Young's modulus of equal to or greater than 0.02 MPa and a peak value of a load measured by a probe tack test at 80° C. is equal to or less (Continued)

than 500 g. A first protective film forming sheet is provided with a first supporting sheet, and the curable resin film is provided on one surface of the first supporting sheet.

17 Claims, 3 Drawing Sheets

(51) Int. Cl.
| | |
|---|---|
| H01L 23/00 | (2006.01) |
| H01L 23/12 | (2006.01) |
| C09J 7/38 | (2018.01) |
| B32B 27/08 | (2006.01) |
| B32B 27/30 | (2006.01) |
| B32B 27/32 | (2006.01) |
| B32B 27/36 | (2006.01) |
| B32B 27/38 | (2006.01) |
| C08L 33/08 | (2006.01) |
| C08L 63/00 | (2006.01) |
| H01L 21/78 | (2006.01) |
| H01L 23/29 | (2006.01) |

(52) U.S. Cl.
CPC ............ *H01L 21/56* (2013.01); *H01L 21/561* (2013.01); *H01L 21/78* (2013.01); *H01L 23/00* (2013.01); *H01L 23/12* (2013.01); *H01L 23/293* (2013.01); *H01L 24/12* (2013.01); *H01L 24/94* (2013.01); *B32B 2307/54* (2013.01); *B32B 2457/14* (2013.01); *C08L 2205/025* (2013.01); *C08L 2205/035* (2013.01); *H01L 2224/12105* (2013.01)

(56) References Cited

U.S. PATENT DOCUMENTS

| | | | |
|---|---|---|---|
| 2008/0124839 | A1 | 5/2008 | Saiki |
| 2014/0008821 | A1* | 1/2014 | Toyoda .................. H01L 24/97 |
| | | | 257/792 |
| 2016/0083537 | A1* | 3/2016 | Shimba ............... H01L 21/6836 |
| | | | 438/108 |
| 2017/0165940 | A1* | 6/2017 | Hayashi .................. G03F 7/038 |
| 2019/0055396 | A1 | 2/2019 | Sato et al. |

FOREIGN PATENT DOCUMENTS

| | | |
|---|---|---|
| JP | 2008-166451 | 7/2008 |
| JP | 2010-073816 | 4/2010 |
| JP | 2013-211439 | 10/2013 |
| JP | 2014-002769 | 1/2014 |
| JP | 2014-017336 | 1/2014 |
| JP | 2014-075215 | 4/2014 |
| TW | 200507208 | 2/2005 |
| TW | 201439273 | 10/2014 |

OTHER PUBLICATIONS

International Search Report for PCT/JP2016/082539 dated Jan. 31, 2017, 2 pages.

Notice of Allowance for JP 2017-537345 dated Aug. 22, 2017, 6 pages.

Notice of Allowance for TW 105135521 dated Jan. 18, 2018, 5 pages.

* cited by examiner

CURABLE RESIN FILM AND FIRST PROTECTIVE FILM FORMING SHEET

CROSS REFERENCE TO RELATED APPLICATIONS

This application is a continuation application of U.S. application Ser. No. 15/770,529, filed Apr. 24, 2018, which is the U.S. national phase of International Application No. PCT/JP2016/082539 filed Nov. 2, 2016 which designated the U.S. and claims priority to Japanese Patent Application No. 2015-217108, filed on Nov. 4, 2015, the entire contents of each of which are incorporated herein by reference.

TECHNICAL FIELD

The present invention relates to a curable resin film and a first protective film forming sheet using the same.
Priority is claimed on Japanese Patent Application No. 2015-217108, filed on Nov. 4, 2015, the disclosure of which is incorporated herein by reference.

BACKGROUND ART

In the related art, in a case in which a multi-pin LSI package, which is used in MPU or a gate array, is mounted on a printed wiring board, a flip chip mounting method in which a semiconductor chip in which convex electrodes (bumps) made of eutectic solder, high-temperature solder, gold, or the like are formed in connection pad portions is used, and these bumps are made to face, brought into contact with, and melting/diffusion-joined to the corresponding terminal portions on a chip mounting substrate using a so-called face down method has been employed.

The semiconductor chip that is used in this mounting method is obtained by, for example, grinding a surface opposite to a circuit surface of a semiconductor wafer having bumps formed on the circuit surface and dicing the semiconductor wafer into pieces. In the process of obtaining the above-described semiconductor chip, generally, for the purpose of protecting the circuit surface and the bumps of the semiconductor wafer, a curable resin film is attached to the bump-formed surface, and this film is cured so as to form a protective film on the bump-formed surface. As a protective film forming sheet provided with the thermosetting resin film containing a thermosetting component in the above curable resin film, a protective film forming sheet formed by stacking a thermoplastic resin layer having a predetermined thermal elastic modulus on the film and further stacking a thermoplastic resin layer which is not plastic at 25° C. on the uppermost layer of the thermoplastic resin layer has been disclosed (refer to Patent Document 1). In addition, according to Patent Document 1, this protective film forming sheet is excellent in terms of the bump filling property of the protective film, the wafer workability, the electric connection reliability after resin sealing, and the like.

On the other hand, as described above, the semiconductor wafer on which the protective film is formed is divided by dicing with the protective film so as to form a semiconductor chip. Dicing is performed by several methods, for example, a method of cutting the semiconductor wafer together with the protective film using a dicing blade, but depending on the type of the protective film, cutting wastes are generated at the time of cutting the protective film, and the cutting wastes may be attached to a side surface of the semiconductor chip after dicing. When extra deposits are present on the semiconductor chip as described above, problems on processes or qualities occur, for example, process troubles may be caused between bonding of the semiconductor chip and obtaining of the semiconductor device, or the reliability of the semiconductor device is deteriorated.

In contrast, it is not certain whether the occurrence of such a problem is suppressed in the conventional protective film including the protective film disclosed in Patent Document 1.

CITATION LIST

Patent Literature

[Patent Document 1] Japanese Unexamined Patent Application, First Publication No. 2005-028734

SUMMARY OF INVENTION

Technical Problem

An object of the present invention is to provide a curable resin film capable of forming a protective film for suppressing attachment of cutting wastes derived from the protective film to a side surface of a semiconductor chip when dicing a semiconductor wafer provided with the protective film on a bump-formed surface, and a protective film forming sheet using the same.

Solution to Problem

According to the present invention, there is provided a curable resin film for forming a first protective film on a surface having bumps of a semiconductor wafer by being attached to the surface and being cured, in which a cured material of the curable resin film has a Young's modulus of equal to or greater than 0.02 MPa or greater and a peak value of a load measured by a probe tack test at 80° C. is equal to or less than 500 g.

In addition, according to the present invention, there is provided a first protective film forming sheet including the curable resin film on one surface of a first supporting sheet.

Advantageous Effects of Invention

By using the curable resin film and the first protective film forming sheet of the present invention, it is possible to suppress attachment of cutting wastes derived from the first protective film to a side surface of a semiconductor chip when dicing a semiconductor wafer having the first protective film on a bump-formed surface.

DESCRIPTION OF EMBODIMENTS

Figure 1:
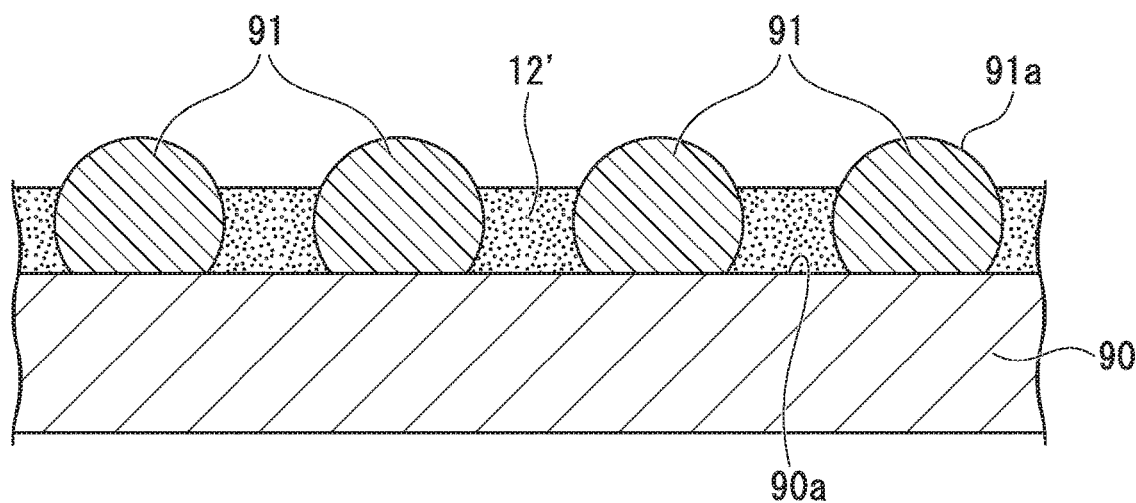
FIG. 1 is a sectional view schematically showing an example of a state in which a first protective film is formed on a bump-formed surface by using a curable resin film of the present invention.

The present invention relates to a curable resin film for forming a first protective film on a surface having bumps of a semiconductor wafer by being attached to the surface and being cured, in which a cured material of the curable resin film has a Young's modulus of equal to or greater than 0.02 MPa and a peak value of a load measured by a probe tack test at 80° C. is equal to or less than 500 g.

In addition, the first protective film forming sheet of the present invention is provided with the curable resin film of the present invention on one surface of the first supporting sheet. In the first protective film forming sheet, the "curable resin film" may be referred to as a "curable resin layer".

The first protective film forming sheet of the present invention is used by attaching the curable resin layer (a curable resin film) to the surface having a bump of the semiconductor wafer (that is, a circuit surface). Then, the curable resin layer after attachment has an increase in fluidity by heating, spreads between the bumps so as to cover the bumps, is close contact with the circuit surface, and embeds the bumps while covering the surface of the bumps, particularly, the surface of the portion in the vicinity of the circuit surface.

The curable resin layer in such a state is further heated or cured by being irradiated with energy ray so as to finally form the first protective film and protects the bump in a state of being in close contact with the surface on the circuit surface. After the semiconductor wafer, on which the first protective film forming sheet, is attached, for example, the surface opposite to the circuit surface is ground, and the first supporting sheet is removed. Then, the bumps are embedded by heating of the curable resin layer and forming the first protective film, and finally, the semiconductor wafer is incorporated into the semiconductor device in a state of being provided with this first protective film.

In this specification, the bump surface and the circuit surface of the semiconductor wafer are collectively referred to as "bump-formed surface" in some cases.

When the curable resin film of the present invention is used, the circuit surface of the semiconductor wafer, a portion in the vicinity of the circuit surface of the bumps, that is, a base portion are sufficiently protected by the first protective film.

The curable resin film of the present invention forms a cured material in which Young's modulus is equal to or greater than 0.02 MPa, and a peak value of load measured by a probe tack test at 80° C. (hereinafter, in some cases, abbreviated as "tack peak load") is equal to or less than 500 g, that is, a first protective film by curing. In other words, the first protective film obtained from the curable resin film of the present invention can have the Young's modulus of equal to or more than 0.02 MPa, and the tack peak load of equal to or less than 500 g at the time of dicing. If the Young's modulus and the tack peak load of the first protective film are within the above range at the time of the dicing, when the first protective film is cut together with the semiconductor wafer through the dicing, the attachment of the cutting wastes is suppressed on the side surface of the semiconductor chip provided with the first protective film after cutting. Therefore, when the semiconductor is manufactured by using the curable resin film of the present invention, occurrence of troubles in the manufacturing step and deterioration in the reliability of the semiconductor device are suppressed.

In the present invention, the Young's modulus and tack peak load can be adjusted by, for example, adjusting the kind and the amount of the contained components of the curable resin film.

FIG. 1 is a sectional view schematically showing an example of a state in which a first protective film is formed on a bump-formed surface by using the curable resin film of the present invention. Note that, in the drawings used in the following description, for the sake of easy understanding of the features of the present invention, and for the sake of convenience, a portion serving as a main part is sometimes enlarged and the dimensional ratio and the like of each component is not necessarily the same as the actual one.

On a circuit surface 90a of the semiconductor wafer 90 shown in the drawing, a plurality of the bumps 91 is provided. The bump 91 has, for example, a shape of a sphere a part of which is cut out along a flat surface, and a flat surface corresponding to a portion exposed by cutting out the above-described part is in contact with the circuit surface 90a of the semiconductor wafer 90.

The first protective film 12' is formed with the curable resin film of the present invention, covers the circuit surface 90a of the semiconductor wafer 90, and further covers an area other than the top surface of the bump 91 and areas of the surface 91a of the bump 91. In this way, the first protective film 12' is close contact with the surface 91a other than the top surface of the bump 91 and the portions in the vicinity thereof, and is also close contact with the circuit surface 90a of the semiconductor wafer 90 so as to embed the bump 91.

The substantially spherical shape of the bump 91 as described above is also particularly advantageous for forming the first protective film using the curable resin film of the present invention.

Note that, the semiconductor wafer for which the curable resin film of the present invention is used is not limited to that shown in FIG. 1, and a configuration in which a part of the configuration is changed, deleted, or added within a range that does not impair the effect of the present invention may be used. For example, FIG. 1 shows a bump having a substantially spherical shape (a shape in which a part of a sphere is cut out by a plane) as described above, and examples of preferred bumps include a bump having a shape obtained by stretching the bump having a substantially spherical shape in a height direction (direction orthogonal to the circuit surface 90a of the semiconductor wafer 90 in FIG. 1), that is, a shape of a spheroid which is substantially a long and spherical shape (a shape in which a portion including one end in the major axis direction of a spheroid which is a long and spherical shape is cut out by a plane), and a bump having a shape obtained by crushing the bump having a substantially spherical shape in a height direction, that is, the shape of a spheroid which is substantially oblate (a shape in which a portion including one end in the minor axis direction of a spheroid which is substantially oblate is cut out by a plane). Such a bump having a substantially spheroidal shape is also particularly advantageous for forming the first protective film using the curable resin film of the present invention, similar to the substantially spherical bump.

Note that, the shape of the bump described so far is merely an example of a preferable example in applying the curable resin film of the present invention, and the shape of the bump is not limited to these in the present invention.

Hereinafter, the configuration of the present invention will be described in detail.

First Supporting Sheet

The first supporting sheet may be a sheet made of a single layer (monolayer) or a sheet made of a plurality of layers (two or more layers). In a case in which the supporting sheet is made of a plurality of layers, the constituent materials and the thicknesses of the plurality of layers may be identical to or different from one another, and the combination of the plurality of layers is not particularly limited as long as the effects of the present invention are not impaired.

Meanwhile, in the present specification, the sentence "a plurality of layers may be identical to or different from one another" means that "all of the layers may be identical to one another, all of the layers may be different from one another, or only some of the layers may be identical to one another", and furthermore, the sentence "a plurality of layers is different from one another" means that "at least one of the constituent materials and the thicknesses of the respective layers are different from one another", which will be true not only for the first supporting sheet but also for other elements.

Examples of a preferred the first supporting sheet include a structure formed by stacking a first pressure-sensitive adhesive layer on a first base material, a structure formed by stacking a first interlayer on the first base material and stacking the first pressure-sensitive adhesive layer on the first interlayer, and a structure formed of the first base material.

An example of the first protective film forming sheet of the present invention will be described with reference to the following drawings for each kind of such first supporting sheet.

Figure 2:
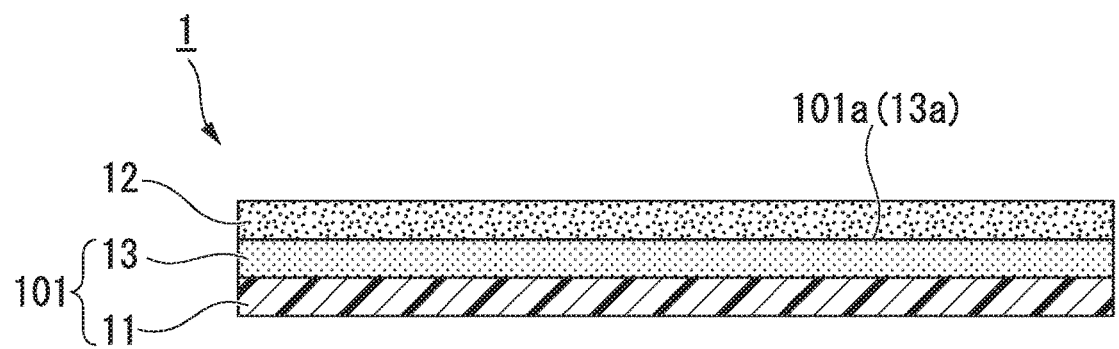
FIG. 2 is a sectional view schematically showing an embodiment of a first protective film forming sheet of the present invention.

FIG. 2 is a sectional view schematically showing an embodiment of the first protective film forming sheet of the present invention. The first protective film forming sheet 1 shown here uses the first supporting sheet obtained by stacking the first pressure-sensitive adhesive layer on the first base material. That is, the first protective film forming sheet 1 is configured to include the first pressure-sensitive adhesive layer 13 on the first base material 11, and the curable resin layer (curable resin film) 12 on the first pressure-sensitive adhesive layer 13. The first supporting sheet 101 is a stacked body of the first base material 11 and the first pressure-sensitive adhesive layer 13, in which the curable resin layer 12 is provided on one surface 101a of the first supporting sheet 101, that is, on one surface 13a of the first pressure-sensitive adhesive layer 13.

In the first protective film forming sheet 1, the curable resin layer 12 forms the first protective film having the Young's modulus and the tack peak load by curing.

Figure 3:
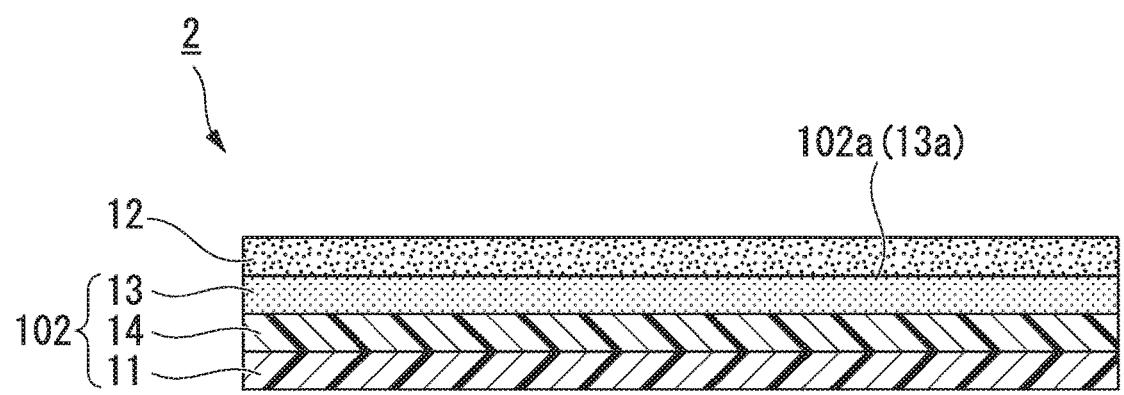
FIG. 3 is a sectional view schematically showing another embodiment of the first protective film forming sheet of the present invention.

FIG. 3 is a sectional view schematically showing another embodiment of the first protective film forming sheet of the present invention. Meanwhile, in FIG. 3, the same constituent element as in FIG. 2 is given the same reference sign as in FIG. 2 and will not be described in detail. What has been described above is also true for FIG. 4 and the subsequent drawings.

The first protective film forming sheet 2 as shown here uses the first supporting sheet obtained by stacking the first interlayer on the first base material, and stacking the first pressure-sensitive adhesive layer on the first interlayer. That is, the first protective film forming sheet 2 is configured to include the first interlayer 14 on the first base material 11, the first pressure-sensitive adhesive layer 13 on the first interlayer 14, and the curable resin layer (curable resin film) 12 on the first pressure-sensitive adhesive layer 13. The first supporting sheet 102 is a stacked body obtained by stacking the first base material 11, the first interlayer 14, and the first pressure-sensitive adhesive layer 13 in this order, in which the curable resin layer 12 is provided on one surface 102a of the first supporting sheet 102, that is, on one surface 13a of the first pressure-sensitive adhesive layer 13.

In other words, the first protective film forming sheet 2 is further provided with the first interlayer 14 between the first base material 11 and the first pressure-sensitive adhesive layer 13 in the first protective film forming sheet 1 as shown in FIG. 2.

In the first protective film forming sheet 2, the curable resin layer 12 forms the first protective film having the above-described Young's modulus and tack peak load by curing.

Figure 4:
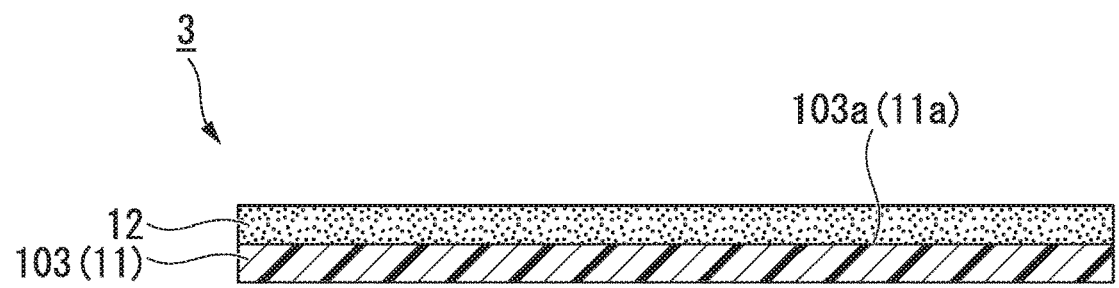
FIG. 4 is a sectional view schematically showing still another embodiment of the first protective film forming sheet of the present invention.

FIG. 4 is a sectional view schematically showing still another embodiment of the first protective film forming sheet of the present invention.

In the first protective film forming sheet 3 as shown here, the first supporting sheet is formed of only the first base material. That is, the first protective film forming sheet 3 is configured to include the curable resin layer (curable resin film) 12 on the first base material 11.

The first supporting sheet 103 is formed of only the first base material 11, the curable resin layer 12 is provided in direct contact with on one surface 103a of the first supporting sheet 103, that is, one surface 11a of the first base material 11.

In other words, the first protective film forming sheet 3 is formed by removing the first pressure-sensitive adhesive layer 13 in the first protective film forming sheet 1 as shown in FIG. 2.

In the first protective film forming sheet 3, the curable resin layer 12 forms the first protective film having the above-described Young's modulus and tack peak load by curing.

Next, the configuration of the first supporting sheet will be described in detail.

First Base Material

The first base material is a sheet-form or film-form base material, and examples of a constituent material thereof include a variety of resins.

Examples of the resins include polyethylene such as low-density polyethylene (LDPE), linear low-density polyethylene (LLDPE), and high-density polyethylene (HDPE); polyolefin other than polyethylene such as polypropylene, polybutene, polybutadiene, polymethylpentene, and norbornene resins; ethylene-based copolymers (copolymers obtained using ethylene as monomers) such as ethylene-vinyl acetate copolymers, ethylene-(meth)acrylate copolymers, ethylene-(meth)acrylic acid ester copolymers, and ethylene-norbornene copolymers; vinyl chloride-based resins (resins obtained using vinyl chloride as monomers) such as polyvinyl chloride and vinyl chloride copolymers; polystyrene; polycycloolefin; polyesters such as polyethylene terephthalate, polyethylene naphthalate, polybutylene terephthalate, polyethylene isophthalate, polyethylene-2,6-naphthalene dicarboxylate, and wholly aromatic polyesters in which all constituent units have an aromatic cyclic group; copolymers of two or more polyester described above; poly(meth)acrylic acid esters; polyurethane; polyurethane acrylate; polyimide; polyamide; polycarbonate; fluororesin; polyacetal; modified polyphenylene oxides; polyphenylene sulfides; polysulfone; polyether ketones; and the like.

In addition, examples of the resins also include polymer alloys such as mixtures of the polyester and other resin are also exemplified. The polymer alloys of the polyester and other resin are preferably polymer alloys in which the amount of the resin other than the polyester is relatively small.

In addition, examples of the resins also include crosslinked resins in which one or more resins exemplified above are crosslinked with each other; modified resins such as ionomers for which one or more resins exemplified above are used; and the like.

Meanwhile, in the present specification, "(meth)acrylic acid" refers to both "acrylic acid" and "methacrylic acid". What has been described above is also true for terminologies similar to (meth)acrylic acid, for example, "(meth)acrylate" refers to both "acrylate" and "methacrylate", and "a (meth) acryloyl group" refers to both "an acryloyl group" and "a methacryloyl group".

Only one type or two or more types of resins may constitute the first base material, and, in a case in which two or more types of resins constitute the first base material, the combination and ratio thereof can be arbitrarily selected.

The first base material may be a single layer (monolayer) or a plurality of layers (two or more layers), and, in a case in which the first base material is a plurality of layers, the respective layers in the plurality of layers may be identical to or different from one another, and the combination of the plurality of layers is not particularly limited.

The thickness of the first base material is preferably 5 to 1,000 μm, more preferably 10 to 500 μm, still more preferably 15 to 300 μm, and particularly preferably 20 to 150 μm.

Here, "the thickness of the first base material" refers to the thickness of the entire first base material, and, for example, the thickness of the first base material made up of a plurality of layers refers to the total thickness of all of the layers constituting the first base material.

The first base material is preferably a first base material having a high accuracy in thickness, that is, a first base material in which the variation of the thickness is suppressed throughout the entire portion. Among the above-described constituent materials, examples of materials that can be used to constitute the above-described first base material having a high accuracy in thickness include polyethylene, polyolefin other than polyethylene, polyethylene terephthalate, ethylene-vinyl acetate copolymers, and the like.

The first base material may also contain, in addition to the main constituent material such as the resin, a variety of well-known additives such as a filler, a colorant, an antistatic agent, an antioxidant, an organic lubricant, a catalyst, and a softening agent (plasticizer).

The first base material may be transparent or opaque and may be colored depending on the purpose. In addition, other layers may be deposited on the first base material.

In a case in which the first pressure-sensitive adhesive layer described below or the curable resin layer is energy ray-curable, the first base material preferably transmits energy rays.

The first base material can be manufactured using a well-known method. For example, the first base material containing the resin can be manufactured by forming a resin composition containing the resin.

First Pressure-Sensitive Adhesive Layer

The first pressure-sensitive adhesive layer has a sheet form or a film form and contains a pressure-sensitive adhesive.

Examples of the pressure-sensitive adhesive include pressure-sensitive adhesive resins such as acrylic resins (pressure-sensitive adhesives made of a resin having a (meth) acryloyl group), urethane-based resins (pressure-sensitive adhesives made of a resin having a urethane bond), rubber-based resins (pressure-sensitive adhesives made of a resin having a rubber structure), silicone-based resins (pressure-sensitive adhesives made of a resin having a siloxane bond), epoxy-based resins (pressure-sensitive adhesives made of a resin having an epoxy group), polyvinyl ethers, and polycarbonate, and acrylic resins are preferred.

Meanwhile, in the present invention, "pressure-sensitive adhesive resins" refer to both resins having a pressure-sensitive adhesiveness and resins having an adhesiveness, and examples thereof include not only resins having an adhesiveness for themselves but also resins exhibiting a pressure-sensitive adhesiveness when jointly used with other components such as additives, resins exhibiting an adhesiveness due to the presence of a trigger such as heat or water, and the like.

The first pressure-sensitive adhesive layer may be a single layer (monolayer) or a plurality of layers of two or more layers, and, in a case in which the first pressure-sensitive adhesive layer is a plurality of layers, the respective layers in the plurality of layers may be identical to or different from one another, and the combination of the plurality of layers is not particularly limited.

The thickness of the first pressure-sensitive adhesive layer is preferably 1 to 1,000 μm, more preferably 5 to 500 μm, and particularly preferably 10 to 100 μm.

Here, "the thickness of the first pressure-sensitive adhesive layer" refers to the thickness of the entire first pressure-sensitive adhesive layer, and, for example, the thickness of the first pressure-sensitive adhesive layer made up of a plurality of layers refers to the total thickness of all of the layers constituting the first pressure-sensitive adhesive layer.

The first pressure-sensitive adhesive layer may be a first pressure-sensitive adhesive layer formed using an energy ray-curable pressure-sensitive adhesive or a first pressure-sensitive adhesive layer formed using a non-energy ray-curable pressure-sensitive adhesive. For the first pressure-sensitive adhesive layer formed using an energy ray-curable pressure-sensitive adhesive, it is possible to easily adjust the properties before curing and after curing.

In the present invention, "energy rays" refer to rays having energy quanta in electromagnetic waves or charged particle radiation, and examples thereof include ultraviolet rays, radiations, electron beams, and the like.

Ultraviolet rays can be radiated using, for example, a high-pressure mercury lamp, a fusion H lamp, a xenon lamp, black light, a LED lamp, or the like as an ultraviolet ray source. As the electron beams, electron beams generated using an electron beam accelerator or the like can be radiated.

In the present invention, "being energy ray-curable" refers to a property of being cured by being irradiated with energy rays, and "being non-energy ray-curable" refers to a property of not being cured by being irradiated with energy rays.

<<First Pressure-Sensitive Adhesive Composition>>

The first pressure-sensitive adhesive layer can be formed using a first pressure-sensitive adhesive composition containing a pressure-sensitive adhesive. For example, the first pressure-sensitive adhesive layer can be formed at an intended portion by applying the first pressure-sensitive adhesive composition to a target surface on which the first pressure-sensitive adhesive layer is to be formed and drying the first pressure-sensitive adhesive composition as necessary. A more specific method for forming the first pressure-sensitive adhesive layer will be described below in detail together with methods for forming other layers. The ratio between the amounts of components, which do not gasify at normal temperature, in the first pressure-sensitive adhesive composition is, generally, identical to the ratio between the amounts of the above-described components in the first pressure-sensitive adhesive layer. Meanwhile, in the present specification, "normal temperature" refers to a temperature that is not particularly cooled or heated, that is, a temperature in an ordinary state, and examples thereof include a temperature of 15° C. to 25° C. and the like.

The first pressure-sensitive adhesive composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the first pressure-sensitive adhesive composition are not particularly limited; however, in a case in which the first pressure-sensitive adhesive composition contains a solvent described below, the first pressure-sensitive adhesive composition is preferably heated and dried. The first pressure-sensitive adhesive composition containing a solvent is preferably dried at 70° C. to 130° C. for 10 seconds to 5 minutes.

In a case in which the first pressure-sensitive adhesive layer is energy ray-curable, examples of the first pressure-sensitive adhesive composition containing an energy ray-curable pressure-sensitive adhesive, that is, an energy ray-curable first pressure-sensitive adhesive composition include a first pressure-sensitive adhesive composition (I-1) containing a non-energy ray-curable pressure-sensitive adhesive resin (I-1a) (hereinafter, in some cases, abbreviated as "the pressure-sensitive adhesive resin (I-1a)") and an energy ray-curable compound; a first pressure-sensitive adhesive composition (I-2) containing an energy ray-curable pressure-sensitive adhesive resin (I-2a) in which an unsaturated group is introduced into a side chain of the non-energy ray-curable pressure-sensitive adhesive resin (I-1a) (hereinafter, in some cases, abbreviated as "the pressure-sensitive adhesive resin (I-2a)"); a first pressure-sensitive adhesive composition (I-3) containing the pressure-sensitive adhesive resin (I-2a) and an energy ray-curable low-molecular-weight compound; and the like.

<First Pressure-Sensitive Adhesive Composition (I-1)>

As described above, the first pressure-sensitive adhesive composition (I-1) contains the non-energy ray-curable pressure-sensitive adhesive resin (I-1a) and an energy ray-curable compound.

[Pressure-Sensitive Adhesive Resin (I-1a)]

The pressure-sensitive adhesive resin (I-1a) is preferably an acrylic resin.

Examples of the acrylic resin include acrylic polymers having at least a constituent unit derived from an alkyl (meth)acrylate.

The acrylic resin may have only one type or two or more types of constituent units, and, in a case in which the acrylic resin has two or more types of constituent units, the combination and ratio thereof can be arbitrarily selected.

Examples of the alkyl (meth)acrylate include alkyl (meth)acrylates in which the number of carbon atoms in an alkyl group constituting the alkyl ester is 1 to 20, and the alkyl group is preferably a linear alkyl group or a branched alkyl group.

More specific examples of the alkyl (meth)acrylate include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, octadecyl (meth)acrylate (stearyl (meth)acrylate), nonadecyl (meth)acrylate, icosyl (meth)acrylate, and the like.

Since the pressure-sensitive adhesive force of the first pressure-sensitive adhesive layer improves, the acrylic polymer preferably has a constituent unit derived from an alkyl (meth)acrylate in which the number of carbon atoms in the alkyl group is four or more. In addition, since the pressure-sensitive adhesive force of the first pressure-sensitive adhesive layer further improves, the number of carbon atoms in the alkyl group is preferably 4 to 12 and more preferably 4 to 8. In addition, the alkyl (meth)acrylate in which the number of carbon atoms in the alkyl group is four or more is preferably alkyl acrylate.

The acrylic polymer preferably further has, in addition to the constituent unit derived from the alkyl (meth)acrylate, a constituent unit derived from a functional group-containing monomer.

Examples of the functional group-containing monomer include monomers in which the functional group reacts with a crosslinking agent described below and thus serves as a starting point of crosslinking or the functional group reacts with an unsaturated group in an unsaturated group-containing compound and thus enables the introduction of the unsaturated group into a side chain of the acrylic polymer.

Examples of the functional group in the functional group-containing monomer include a hydroxyl group, a carboxy group, an amino group, an epoxy group, and the like.

That is, examples of the functional group-containing monomer include hydroxyl group-containing monomers, carboxy group-containing monomers, amino group-containing monomers, epoxy group-containing monomers, and the like.

Examples of the hydroxyl group-containing monomers include hydroxyalkyl (meth)acrylates such as hydroxymethyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; non-(meth)acrylic unsaturated alcohols such as vinyl alcohol and allyl alcohol (unsaturated alcohols not having a (meth)acryloyl skeleton); and the like.

Examples of the carboxy group-containing monomers include ethylenic unsaturated monocarboxylic acids such as (meth)acrylic acid and crotonic acid (monocarboxylic acids having an ethylenic unsaturated bond); ethylenic unsaturated dicarboxylic acids such as fumaric acid, itaconic acid, maleic acid, and citraconic acid (dicarboxylic acids having an ethylenic unsaturated bond); anhydrides of the ethylenic unsaturated dicarboxylic acid; carboxyalkyl (meth)acrylates such as 2-carboxyethyl methacrylate; and the like.

The functional group-containing monomer is preferably the hydroxyl group-containing monomer or the carboxy group-containing monomer and more preferably the hydroxyl group-containing monomer.

The acrylic polymer may be constituted of only one type or two or more types of the functional group-containing monomers, and, in a case in which the acrylic polymer is constituted of two or more types of the functional group-containing monomers, the combination and ratio thereof can be arbitrarily selected.

In the acrylic polymer, the amount of the constituent unit derived from the functional group-containing monomer is preferably 1% to 35% by mass, more preferably 3% to 32% by mass, and particularly preferably 5% to 30% by mass with respect to the total mass of the constituent units.

The acrylic polymer may further have, in addition to the constituent unit derived from the alkyl (meth)acrylate and the constituent unit derived from the functional group-containing monomer, a constituent unit derived from a different monomer.

The different monomer is not particularly limited as long as the monomer can be copolymerized with the alkyl (meth)acrylate or the like.

Examples of the different monomer include styrene, α-methylstyrene, vinyl toluene, vinyl formate, vinyl acetate, acrylonitrile, acrylamide, and the like.

The acrylic polymer may be constituted of only one type or two or more types of the different monomers, and, in a case in which the acrylic polymer is constituted of two or more types of the different monomers, the connection and ratio thereof can be arbitrarily selected.

The acrylic polymer can be used as the non-energy ray-curable pressure-sensitive adhesive resin (I-1a).

Meanwhile, a substance obtained by causing an unsaturated group-containing compound having an energy ray-polymerizable unsaturated group (energy ray-polymerizable group) to react with the functional group in the acrylic polymer can be used as the energy ray-curable pressure-sensitive adhesive resin (I-2a).

Meanwhile, in the present invention, "being energy ray-polymerizable" refers to a property of being polymerized by being irradiated with energy rays.

The first pressure-sensitive adhesive composition (I-1) may contain only one type or two or more types of the pressure-sensitive adhesive resins (I-1a), and, in a case in which the first pressure-sensitive adhesive composition contains two or more types of the pressure-sensitive adhesive resins, the combination and ratio thereof can be arbitrarily selected.

In the first pressure-sensitive adhesive composition (I-1), the amount of the pressure-sensitive adhesive resin (I-1a) is preferably 5% to 99% by mass, more preferably 10% to 95% by mass, and particularly preferably 15% to 90% by mass.

[Energy Ray-Curable Compounds]

Examples of the energy ray-curable compound contained in the first pressure-sensitive adhesive composition (I-1) include monomers or oligomers which have an energy ray-polymerizable unsaturated group and can be cured by being irradiated with energy rays.

Among the energy ray-curable compounds, examples of monomers include polyhydric (meth)acrylates such as trimethylol propane tri(meth)acrylate, pentaerythritol (meth)acrylate, pentaerythritol tetra(meth)acrylate, dipentaerythritol hexa(meth)acrylate, 1,4-butylene glycol di(meth)acrylate, and 1,6-hexanediol (meth)acrylate; urethane (meth)acrylate; polyester (meth)acrylate; polyether (meth)acrylate; epoxy (meth)acrylate; and the like.

Among the energy ray-curable compounds, examples of oligomers include oligomers obtained by polymerizing the monomers exemplified above.

The energy ray-curable compound is preferably urethane (meth)acrylate or a urethane (meth)acrylate oligomer since the molecular weight is relatively large and these do not tend to decrease the storage elastic modulus of the first pressure-sensitive adhesive layer.

The first pressure-sensitive adhesive composition (I-1) may contain only one type or two or more types of the energy ray-curable compounds, and, in a case in which the first pressure-sensitive adhesive composition contains two or more types of the energy ray-curable compounds, the combination and ratio thereof can be arbitrarily selected.

In the first pressure-sensitive adhesive composition (I-1), the amount of the energy ray-curable compound is preferably 1% to 95% by mass, more preferably 5% to 90% by mass, and particularly preferably 10% to 85% by mass.

[Crosslinking Agent]

In a case in which the acrylic polymer further having, in addition to the constituent unit derived from the alkyl (meth)acrylate, the constituent unit derived from the functional group-containing monomer as the pressure-sensitive adhesive resin (I-1a), the first pressure-sensitive adhesive composition (I-1) preferably further contains a crosslinking agent.

The crosslinking agent is, for example, a substance that reacts with the functional group and thus crosslinks the pressure-sensitive adhesive resins (I-1a).

Examples of the crosslinking agent include isocyanate-based crosslinking agents (crosslinking agents having an isocyanate group) such as tolylene diisocyanate, hexamethylene diisocyanate, xylylene diisocyanate, and adduct bodies of the above-described diisocyanate; epoxy-based crosslinking agents (crosslinking agents having a glycidyl group) such as ethylene glycol glycidyl ether; aziridine-based crosslinking agents (crosslinking agents having an aziridinyl group) such as hexa[1-(2-methyl)-aziridinyl]triphosphatriazine; metal chelate-based crosslinking agents (crosslinking agents having a metal chelate structure) such as aluminum chelates; isocyanurate-based crosslinking agents (crosslinking agents having an isocyanuric acid skeleton); and the like.

The crosslinking agent is preferably the isocyanate-based crosslinking agent since the isocyanate-based crosslinking agent improves the cohesive force of the pressure-sensitive adhesive so as to improve the pressure-sensitive adhesive force of the first pressure-sensitive adhesive layer, is easily procurable, and the like.

The first pressure-sensitive adhesive composition (I-1) may contain only one type or two or more types of the crosslinking agents, and, in a case in which the first pressure-sensitive adhesive composition contains two or more types of the crosslinking agents, the combination and ratio thereof can be arbitrarily selected.

In the first pressure-sensitive adhesive composition (I-1), the amount of the crosslinking agent is preferably 0.01 to 50 parts by mass, more preferably 0.1 to 20 parts by mass, and particularly preferably 1 to 10 parts by mass with respect to the amount (100 parts by mass) of the pressure-sensitive adhesive resin (I-1a).

[Photopolymerization Initiator]

The first pressure-sensitive adhesive composition (I-1) may also further contain a photopolymerization initiator. The first pressure-sensitive adhesive composition (I-1) containing the photopolymerization initiator sufficiently proceeds with a curing reaction even when irradiated with energy rays having a relatively low energy such as ultraviolet rays.

Examples of the photopolymerization initiator include benzoin compounds such as benzoin, benzoin methyl ether, benzoin ethyl ether, benzoin isopropyl ether, benzoin isobutyl ether, benzoin benzoate, methyl benzoin benzoate, and benzoin dimethyl ketal; acetophenone compounds such as acetophenone, 2-hydroxy-2-methyl-1-phenyl-propane-1-one, and 2,2-dimethoxy-1,2-diphenylethane-1-one; acylphosphine oxide compounds such as bis(2,4,6-trimethylbenzoyl)phenylphosphine oxide and 2,4,6-trimethylbenzoyldiphenylphosphine oxide; sulfide compounds such as benzylphenyl sulfide and tetramethylthiuram monosulfide; α-ketol compounds such as 1-hydroxycyclohexyl phenyl ketone; azo compounds such as azobisisobutylonitrile; titanocene compounds such as titanocene; thioxanthone compounds such as thioxanthone; peroxide compounds; diketone compounds such as diacetyl; benzyl; dibenzyl; benzophenone; 2,4-diethylthioxanthone; 1,2-diphenylmethane; 2-hydroxy-2-methyl-1-[4-(1-methylvinyl)phenyl]propanone; 2-chloroanthraquinone, and the like.

In addition, as the photopolymerization initiator, for example, a quinone compound such as 1-chloroanthraquinone; a photosensitizer such as amine; or the like can also be used.

The first pressure-sensitive adhesive composition (I-1) may contain only one type or two or more types of the photopolymerization initiators, and, in a case in which the first pressure-sensitive adhesive composition contains two or more types of the photopolymerization initiators, the combination and ratio thereof can be arbitrarily selected.

In the first pressure-sensitive adhesive composition (I-1), the amount of the photopolymerization initiator is preferably 0.01 to 20 parts by mass, more preferably 0.03 to 10 parts by mass, and particularly preferably 0.05 to 5 parts by mass with respect to the amount (100 parts by mass) of the energy ray-curable compound.

[Other Additives]

The first pressure-sensitive adhesive composition (I-1) may also contain other additives which do not correspond to any of the above-described components as long as the effects of the present invention are not impaired.

Examples of the other additives include a variety of well-known additives such as an antistatic agent, an antioxidant, a softening agent (plasticizer), a filler (filler), an antirust agent, a colorant (a pigment or a dye), a sensitizer, a tackifier, a reaction retardant, and a crosslinking accelerator (catalyst).

Meanwhile, the reaction retardant is a substance that suppresses the progress of an unintended crosslinking reaction in the first pressure-sensitive adhesive composition (I-1) under storage due to, for example, the action of the catalyst mixed into the first pressure-sensitive adhesive composition (I-1). Examples of the reaction retardant include reaction retardants that form a chelate complex by chelating with respect to the catalyst, and more specific examples thereof include substances having two or more carbonyl groups (—C(=O)—) in one molecule.

The first pressure-sensitive adhesive composition (I-1) may contain only one type or two or more types of the other additives, and, in a case in which the first pressure-sensitive adhesive composition contains two or more types of the other additives, the combination and ratio thereof can be arbitrarily selected.

In the first pressure-sensitive adhesive composition (I-1), the amount of the other additives is not particularly limited and may be appropriately selected depending on the type of the additives.

[Solvent]

The first pressure-sensitive adhesive composition (I-1) may also contain a solvent. When the first pressure-sensitive adhesive composition (I-1) contains a solvent, the coating aptitude to a coating target surface improves.

The solvent is preferably an organic solvent, and examples of the organic solvent include ketones such as methyl ethyl ketone and acetone; esters (carboxylic acid esters) such as ethyl acetate; ethers such as tetrahydrofuran and dioxane; aliphatic hydrocarbons such as cyclohexane and n-hexane; aromatic hydrocarbons such as toluene and xylene; alcohols such as 1-propanol and 2-propanol; and the like.

As the solvent, a solvent used during the manufacturing of the pressure-sensitive adhesive resin (I-1a) may be continuously used in the first pressure-sensitive adhesive composition (I-1) without being removed from the pressure-sensitive adhesive resin (I-1a) or a solvent of the same type as or a different type from the solvent used during the manufacturing of the pressure-sensitive adhesive resin (I-1a) may be separately added during the manufacturing of the first pressure-sensitive adhesive composition (I-1).

The first pressure-sensitive adhesive composition (I-1) may contain only one type or two or more types of the solvents, and, in a case in which the first pressure-sensitive adhesive composition contains two or more types of the solvents, the combination and ratio thereof can be arbitrarily selected.

In the first pressure-sensitive adhesive composition (I-1), the amount of the solvent is not particularly limited and may be appropriately adjusted.

<First Pressure-Sensitive Adhesive Composition (I-2)>

As described above, the first pressure-sensitive adhesive composition (I-2) contains an energy ray-curable pressure-sensitive adhesive resin (I-2a) in which an unsaturated group is introduced into a side chain of the non-energy ray-curable pressure-sensitive adhesive resin (I-1a).

[Pressure-Sensitive Adhesive Resin (I-2a)]

The pressure-sensitive adhesive resin (I-2a) can be obtained by, for example, causing an unsaturated group-containing compound having an energy ray-polymerizable unsaturated group to react with the functional group in the pressure-sensitive adhesive resin (I-1a).

The unsaturated group-containing compound is a compound further having, in addition to the energy ray-polymerizable unsaturated group, a group that can be bonded with the pressure-sensitive adhesive resin (I-1a) by reacting with the functional group in the pressure-sensitive adhesive resin (I-1a).

Examples of the energy ray-polymerizable unsaturated group include a (meth)acryloyl group, a vinyl group (ethenyl group), an allyl group (2-propenyl group), and the like, and a (meth)acryloyl group is preferred.

Examples of the group that can be bonded with the functional group in the pressure-sensitive adhesive resin (I-1a) include isocyanate groups and glycidyl groups that can be bonded with a hydroxyl group or an amino group, hydroxyl groups and amino groups that can be bonded with a carboxy group or an epoxy group, and the like.

Examples of the unsaturated group-containing compound include (meth)acryloyloxyethyl isocyanate, (meth)acryloyl isocyanate, glycidyl (meth)acrylate, and the like.

The first pressure-sensitive adhesive compositions (I-2) may contain only one type or two or more types of the pressure-sensitive adhesive resins (I-2a), and, in a case in which the first pressure-sensitive adhesive composition contains two or more types of the pressure-sensitive adhesive resins, the combination and ratio thereof can be arbitrarily selected.

In the first pressure-sensitive adhesive composition (I-2), the amount of the pressure-sensitive adhesive resin (I-2a) is preferably 5% to 99% by mass, more preferably 10% to 95% by mass, and particularly preferably 10% to 90% by mass.

[Crosslinking Agent]

In a case in which, as the pressure-sensitive adhesive resin (I-2a), for example, the acrylic polymer having the constituent unit derived from the functional group-containing monomer, which is the same as that in the pressure-sensitive adhesive resin (I-1a) is used, the first pressure-sensitive adhesive composition (I-2) may further contain a crosslinking agent.

Examples of the crosslinking agent in the first pressure-sensitive adhesive composition (I-2) include the same crosslinking agents as those in the first pressure-sensitive adhesive composition (I-1).

The first pressure-sensitive adhesive composition (I-2) may contain only one type or two or more types of the crosslinking agents, and, in a case in which the first pressure-sensitive adhesive composition contains two or more types of the crosslinking agents, the combination and ratio thereof can be arbitrarily selected.

In the first pressure-sensitive adhesive composition (I-2), the amount of the crosslinking agent is preferably 0.01 to 50 parts by mass, more preferably 0.1 to 20 parts by mass, and particularly preferably 1 to 10 parts by mass with respect to the amount (100 parts by mass) of the pressure-sensitive adhesive resin (I-2a).

[Photopolymerization Initiator]

The first pressure-sensitive adhesive composition (I-2) may also further contain a photopolymerization initiator. The first pressure-sensitive adhesive composition (I-2) containing the photopolymerization initiator sufficiently proceeds with a curing reaction even when irradiated with energy rays having a relatively low energy such as ultraviolet rays.

Examples of the photopolymerization initiator in the first pressure-sensitive adhesive composition (I-2) include the same photopolymerization initiators as those in the first pressure-sensitive adhesive composition (I-1).

The first pressure-sensitive adhesive composition (I-2) may contain only one type or two or more types of the photopolymerization initiators, and, in a case in which the first pressure-sensitive adhesive composition contains two or more types of the photopolymerization initiators, the combination and ratio thereof can be arbitrarily selected.

In the first pressure-sensitive adhesive composition (I-2), the amount of the photopolymerization initiator is preferably 0.01 to 20 parts by mass, more preferably 0.03 to 10 parts by mass, and particularly preferably 0.05 to 5 parts by mass with respect to the amount (100 parts by mass) of the pressure-sensitive adhesive resin (I-2a).

[Other Additives]

The first pressure-sensitive adhesive composition (I-2) may also contain other additives which do not correspond to any of the above-described components as long as the effects of the present invention are not impaired.

Examples of the other additives in the first pressure-sensitive adhesive composition (I-2) include the same other additives as those in the first pressure-sensitive adhesive composition (I-1).

The first pressure-sensitive adhesive composition (I-2) may contain only one type or two or more types of the other additives, and, in a case in which the first pressure-sensitive adhesive composition (I-2) contains two or more types of the other additives, the combination and ratio thereof can be arbitrarily selected.

In the first pressure-sensitive adhesive composition (I-2), the amount of the other additives is not particularly limited and may be appropriately selected depending on the type of the additives.

[Solvent]

The first pressure-sensitive adhesive composition (I-2) may also contain a solvent for the same purpose as in the case of the first pressure-sensitive adhesive composition (I-1).

Examples of the solvent in the first pressure-sensitive adhesive composition (I-2) include the same solvents as those in the first pressure-sensitive adhesive composition (I-1).

The first pressure-sensitive adhesive composition (I-2) may contain only one type or two or more types of the solvents, and, in a case in which the first pressure-sensitive adhesive composition contains two or more types of the solvents, the combination and ratio thereof can be arbitrarily selected.

In the first pressure-sensitive adhesive composition (I-2), the amount of the solvent is not particularly limited and may be appropriately adjusted.

<First Pressure-Sensitive Adhesive Composition (I-3)>

As described above, the first pressure-sensitive adhesive composition (I-3) contains the pressure-sensitive adhesive resin (I-2a) and an energy ray-curable low-molecular-weight compound.

In the first pressure-sensitive adhesive composition (I-3), the amount of the pressure-sensitive adhesive resin (I-2a) is preferably 5% to 99% by mass, more preferably 10% to 95% by mass, and particularly preferably 15% to 90% by mass.

[Energy Ray-Curable Low-Molecular-Weight Compound]

Examples of the energy ray-curable low-molecular-weight compound contained in the first pressure-sensitive adhesive composition (I-3) include monomers or oligomers which have an energy ray-polymerizable unsaturated group and can be cured by being irradiated with energy rays and include the same energy ray-curable compounds as that in the first pressure-sensitive adhesive composition (I-1).

The first pressure-sensitive adhesive composition (I-3) may contain only one type or two or more types of the energy ray-curable low-molecular-weight compounds, and, in a case in which the first pressure-sensitive adhesive composition (I-3) contains two or more types of the energy ray-curable low-molecular-weight compounds, the combination and ratio thereof can be arbitrarily selected.

In the first pressure-sensitive adhesive composition (I-3), the amount of the energy ray-curable low-molecular-weight compound is preferably 0.01 to 300 parts by mass, more preferably 0.03 to 200 parts by mass, and particularly preferably 0.05 to 100 parts by mass with respect to the amount (100 parts by mass) of the pressure-sensitive adhesive resin (I-2a).

[Photopolymerization Initiator]

The first pressure-sensitive adhesive composition (I-3) may also further contain a photopolymerization initiator. The first pressure-sensitive adhesive composition (I-3) containing the photopolymerization initiator sufficiently proceeds with a curing reaction even when irradiated with energy rays having a relatively low energy such as ultraviolet rays.

Examples of the photopolymerization initiator in the first pressure-sensitive adhesive composition (I-3) include the same photopolymerization initiators as those in the first pressure-sensitive adhesive composition (I-1).

The first pressure-sensitive adhesive composition (I-3) may contain only one type or two or more types of the photopolymerization initiators, and, in a case in which the first pressure-sensitive adhesive composition contains two or more types of the photopolymerization initiators, the combination and ratio thereof can be arbitrarily selected.

In the first pressure-sensitive adhesive composition (I-3), the amount of the photopolymerization initiator is preferably 0.01 to 20 parts by mass, more preferably 0.03 to 10 parts by mass, and particularly preferably 0.05 to 5 parts by mass with respect to the total amount (100 parts by mass) of the pressure-sensitive adhesive resin (I-2a) and the energy ray-curable low-molecular-weight compound.

[Other Additives]

The first pressure-sensitive adhesive composition (I-3) may also contain other additives which do not correspond to any of the above-described components as long as the effects of the present invention are not impaired.

Examples of the other additives include the same other additives as those in the first pressure-sensitive adhesive composition (I-1).

The first pressure-sensitive adhesive composition (I-3) may contain only one type or two or more types of the other additives, and, in a case in which the first pressure-sensitive adhesive composition contains two or more types of the other additives, the combination and ratio thereof can be arbitrarily selected.

In the first pressure-sensitive adhesive composition (I-3), the amount of the other additives is not particularly limited and may be appropriately selected depending on the type of the additives.

[Solvent]

The first pressure-sensitive adhesive composition (I-3) may also contain a solvent for the same purpose as in the case of the first pressure-sensitive adhesive composition (I-1).

Examples of the solvent in the first pressure-sensitive adhesive composition (I-3) include the same solvents as those in the first pressure-sensitive adhesive composition (I-1).

The first pressure-sensitive adhesive composition (I-3) may contain only one type or two or more types of the solvents, and, in a case in which the first pressure-sensitive adhesive composition contains two or more types of the solvents, the combination and ratio thereof can be arbitrarily selected.

In the first pressure-sensitive adhesive composition (I-3), the amount of the solvent is not particularly limited and may be appropriately adjusted.

<First Pressure-Sensitive Adhesive Compositions Other than First Pressure-Sensitive Adhesive Compositions (I-1) to (I-3)>

Hitherto, the first pressure-sensitive adhesive composition (I-1), the first pressure-sensitive adhesive composition (I-2), and the first pressure-sensitive adhesive composition (I-3) have been mainly described, but the substances described as the contained components thereof can also be used in the same manner in general first pressure-sensitive adhesive compositions other than the above-described three types of first pressure-sensitive adhesive compositions (in the present specification, referred to as the first pressure-sensitive adhesive compositions other than the first pressure-sensitive adhesive compositions (I-1) to (I-3)).

Examples of the first pressure-sensitive adhesive compositions other than the first pressure-sensitive adhesive compositions (I-1) to (I-3) include, in addition to, the energy ray-curable pressure-sensitive adhesive compositions, a non-energy ray-curable pressure-sensitive adhesive composition.

Examples of the non-energy ray-curable pressure-sensitive adhesive compositions include non-energy ray-curable pressure-sensitive adhesive compositions containing a pressure-sensitive adhesive resin such as an acrylic resin (a resin having a (meth)acryloyl group), an urethane-based resin (a resin having a urethane bond), a rubber-based resin (a resin having a rubber structure), a silicone-based resin (a resin having a siloxane bond), an epoxy-based resin (a resin having an epoxy group), a polyvinyl ether, or a polycarbonate, and non-energy ray-curable pressure-sensitive adhesive compositions containing an acrylic resin are preferred.

The first pressure-sensitive adhesive compositions other than the first pressure-sensitive adhesive compositions (I-1) to (I-3) preferably contain one or more types of crosslinking agents, and the amount thereof can be set to be the same as that in the case of the above-described first pressure-sensitive adhesive composition (I-1) or the like.

<<Method for Manufacturing First Pressure-Sensitive Adhesive Composition>>

The first pressure-sensitive adhesive compositions such as the first pressure-sensitive adhesive compositions (I-1) to (I-3) can be obtained by blending individual components for constituting the first pressure-sensitive adhesive compositions such as the pressure-sensitive adhesive, components other than the pressure-sensitive adhesive as necessary, and the like.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

First Interlayer

The first interlayer has a sheet form or a film form, and a constituent material thereof may be appropriately selected depending on the purpose and is not particularly limited.

For example, in a case in which the purpose is to suppress the deformation of the protective film by reflecting the shape of bumps present on a semiconductor surface in the protective film that covers the semiconductor surface, examples of a preferred constituent material of the first interlayer include urethane (meth)acrylate and the like from the viewpoint of further improving the attachment property of the first interlayer.

The first interlayer may be a single layer (monolayer) or a plurality of layers of two or more layers, and, in a case in which the first interlayer is a plurality of layers, the respective layers in the plurality of layers may be identical to or different from one another, and the combination of the plurality of layers is not particularly limited.

The thickness of the first interlayer can be appropriately adjusted depending on the height of bumps on the semiconductor surface which is a protection target, but is preferably 50 to 600 µm, more preferably 70 to 500 µm, and particularly preferably 80 to 400 µm since it is possible to relatively easily absorb the influence of bumps having a relatively high height.

Here, "the thickness of the first interlayer" refers to the thickness of the entire first interlayer, and, for example, the thickness of the first interlayer made up of a plurality of layers refers to the total thickness of all of the layers constituting the first interlayer.

<<First Interlayer Forming Composition>>

The first interlayer can be formed using a first interlayer forming composition containing the constituent material.

For example, the first interlayer can be formed at an intended portion by applying the first interlayer forming composition to a target surface on which the first interlayer is to be formed and drying the first interlayer forming composition or curing the first interlayer forming composition by being irradiated with energy rays as necessary. A more specific method for forming the first interlayer will be described below in detail together with methods for forming other layers. The ratio between the amounts of components, which do not gasify at normal temperature, in the first interlayer forming composition is, generally, identical to the ratio between the amounts of the above-described components in the first interlayer. Here, "normal temperature" is as described above.

The first interlayer forming composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the first interlayer forming composition are not particularly limited. For example, in this case, the first interlayer forming composition containing the solvent described below is preferably heated and dried, and in this case, it is preferably dried under conditions of, for example, 70° C. to 130° C. and 10 seconds to five minutes.

In a case in which the first interlayer forming composition is energy ray-curable, the first interlayer forming composition is preferably further cured by being irradiated with energy rays after drying.

Examples of the first interlayer forming composition include a first interlayer forming composition (II-1) containing urethane (meth)acrylate and the like.

<First Interlayer Forming Composition (II-1)>

As described above, the first interlayer forming composition (II-1) contains urethane (meth)acrylate.

[Urethane (Meth)acrylate]

The urethane (meth)acrylate is a compound having at least a (meth)acryloyl group and a urethane bond in one molecule and is energy ray-polymerizable.

The urethane (meth)acrylate may be a monofunctional urethane (meth)acrylate (urethane (meth)acrylate having only one (meth)acryloyl group in one molecule) or may be a di- or higher-functional urethane (meth)acrylate (urethane (meth)acrylate having two or more (meth)acryloyl groups in one molecule), that is, a multifunctional urethane (meth) acrylate. However, in the present invention, it is preferable to use at least monofunctional urethane (meth) acrylate.

Examples of the urethane (meth)acrylate contained in the first interlayer forming composition include urethane (meth) acrylate obtained by further causing a (meth)acrylic compound having a hydroxyl group and a (meth)acryloyl group to react with a terminal isocyanate urethane prepolymer obtained by reacting a polyol compound and a polyhydric isocyanate compound. Here, "the terminal isocyanate urethane prepolymer" refers to a prepolymer having a urethane bond and having an isocyanate group at a terminal portion of the molecule.

The first interlayer forming composition (II-1) may contain only one type or two or more types of the urethane (meth)acrylate, and, in a case in which the first interlayer forming composition (II-1) contains two or more types of the urethane (meth)acrylate, the combination and ratio thereof can be arbitrarily selected.

(Polyol Compound)

The polyol compound is not particularly limited as long as the compound has two or more hydroxyl groups in one molecule.

One type of the polyol compound may be used singly or two or more types of the polyol compounds may be jointly used; however, in a case in which two or more types of the polyol compounds are jointly used, the combination and ratio thereof can be arbitrarily selected.

Examples of the polyol compound include alkylenediol, polyether-type polyols, polyester-type polyols, polycarbonate-type polyols, and the like.

The polyol compound may be any one of a difunctional diol, a trifunctional triol, and tetra- or higher-functional polyols, but a diol is preferred since the diol can be easily procured and is excellent in terms of versatility, reactivity, and the like.

Polyether-Type Polyol

The polyether-type polyol is not particularly limited, but is preferably a polyether-type diol, and examples of the polyether-type diol include compounds represented by General Formula (1).

[Chemical Formula 1]

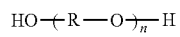

(1)

(In the formula, n represents an integer of 2 or more; R represents a divalent hydrocarbon group, and a plurality of Rs may be identical to or different from one another)

In the formula, n represents the number of repeating units of a group represented by General Formula "—R—O—" and is not particularly limited as long as n is an integer of 2 or more. Among these, n is preferably 10 to 250, more preferably 25 to 205, and particularly preferably 40 to 185.

In the formula, R is not particularly limited as long as R is a divalent hydrocarbon group, but is preferably an alkylene group, more preferably an alkylene group having 1 to 6 carbon atoms, still more preferably an ethylene group, a propylene group, or a tetramethylene group, and particularly preferably a propylene group or a tetramethylene group.

The compound represented by Formula (1) is preferably polyethylene glycol, polypropylene glycol or polytetramethylene glycol and more preferably polypropylene glycol or polytetramethylene glycol.

When the polyether-type diol and the polyhydric isocyanate compound are reacted with each other, urethane (meth) acrylate having an ether bond portion represented by General Formula (1a) as the terminal isocyanate urethane prepolymer can be obtained. In addition, when the above-described terminal isocyanate urethane prepolymer is used, the urethane (meth)acrylate has the ether bond portion, that is, has a constituent unit derived from the polyether-type diol.

[Chemical Formula 2]

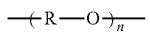

(1a)

(In the formula, R and n are the same as described above)

Polyester-Type Polyol

The polyester-type polyol is not particularly limited, and examples thereof include polyols obtained by causing an esterification reaction using a polybasic acid or a derivative thereof, and the like. Meanwhile, in the present specification, unless particularly otherwise described, "a derivative" refers to a compound in which one or more groups are substituted with other groups (substituents). Here, "a group" refers not only to an atomic group formed by bonding a plurality of atoms but also to one atom.

Examples of the polybasic acid or the derivative thereof include polybasic acids that are ordinarily used as a manufacturing raw material of polyesters and derivatives thereof.

Examples of the polybasic acids include saturated aliphatic polybasic acids, unsaturated aliphatic polybasic acids, aromatic polybasic acids, and the like, and dimer acids corresponding to any of the above-described polybasic acids may also be used.

Examples of the saturated aliphatic polybasic acids include saturated aliphatic dibasic acids such as oxalic acid, malonic acid, succinic acid, glutaric acid, adipic acid, pimelic acid, suberic acid, azelaic acid, and sebacic acid, and the like.

Examples of the unsaturated aliphatic polybasic acids include unsaturated aliphatic dibasic acids such as maleic acid and fumaric acid.

Examples of the aromatic polybasic acids include aromatic dibasic acids such as phthalic acid, isophthalic acid, terephthalic acid, and 2,6-naphthalenedicarboxylic acid; aromatic tribasic acids such as trimellitic acid; aromatic tetrabasic acids such as pyromellitic acid; and the like.

Examples of the derivatives of the polybasic acids include acid anhydrides of the saturated aliphatic polybasic acids, the unsaturated aliphatic polybasic acids, and the aromatic polybasic acids described above, hydrogenated dimer acids, and the like.

One type of any of the polybasic acids or the derivatives thereof may be used singly or two or more types of any of the polybasic acids or the derivatives thereof may be jointly used, and, in a case in which two or more types of any of the polybasic acids or the derivatives thereof are jointly used, the combination and ratio thereof can be arbitrarily selected.

The polybasic acid is preferably the aromatic polybasic acid since the aromatic polybasic acid is suitable for the formation of coated films having an appropriate hardness.

In the esterification reaction for obtaining the polyester-type polyol, a well-known catalyst may also be used as necessary.

Examples of the catalyst include tin compounds such as dibutyltin oxide and stannous octanoate; alkoxy titanium such as tetrabutyl titanate and tetrapropyl titanate; and the like.

Polycarbonate-Type Polyol

The polycarbonate-type polyol is not particularly limited, and examples thereof include polycarbonates obtained by reacting the same glycol as the compound represented by Formula (1) and alkylene carbonate, and the like.

Here, one type of any of the glycol and the alkylene carbonate may be used singly or two or more types of any of the glycol and the alkylene carbonate may be jointly used, and, in a case in which two or more types of any of the glycol and the alkylene carbonate are jointly used, the combination and ratio thereof can be arbitrarily selected.

The number-average molecular weight calculated from the hydroxyl value of the polyol compound is preferably 1,000 to 10,000, more preferably 2,000 to 9,000, and particularly preferably 3,000 to 7,000. When the number-average molecular weight is 1,000 or more, the excess generation of urethane bonds is suppressed, and it becomes easier to suppress the viscoelastic characteristic of the first interlayer. In addition, when the number-average molecular weight is 10,000 or less, the excess softening of the first interlayer is suppressed.

The number-average molecular weight calculated from the hydroxyl value of the polyol compound refers to a value computed from the following expression.

[The number-average molecular weight of the polyol compound]=[the number of functional groups in the polyol compound]×56.11×1,000/[the hydroxyl value of the polyol compound (unit: mgKOH/g)]

The polyol compound is preferably the polyether-type polyol and more preferably a polyether-type diol.

(Polyhydric Isocyanate Compound)

The polyhydric isocyanate compound that is reacted with the polyol compound is not particularly limited as long as the polyhydric isocyanate compound has two or more isocyanate groups.

One type of the polyhydric isocyanate compound may be used singly or two or more types of the polyhydric isocyanate compounds may be jointly used, and, in a case in which two or more types of the polyhydric isocyanate compounds are jointly used, the combination and ratio thereof can be arbitrarily selected.

Examples of the polyhydric isocyanate compound include chain-like aliphatic diisocyanates such as tetramethylene diisocyanate, hexamethylene diisocyanate, and trimethyl hexamethylene diisocyanate; cyclic aliphatic diisocyanates such as isophorone diisocyanate, norbornane diisocyanate, dicyclohexylmethane-4,4'-diisocyanate, dicyclohexylmethane-2,4'-diisocyanate, and ω,ω'-diisocyanate dimethyl cyclohexane; aromatic diisocyanates such as 4,4'-diphenyl methane diisocyanate, tolylene diisocyanate, xylylene diisocyanate, tolidine diisocyanate, tetramethylene xylylene diisocyanate, and naphthalene-1,5-diisocyanate; and the like.

Among these, the polyhydric isocyanate compound is preferably isophorone diisocyanate, hexamethylene diisocyanate, or xylylene diisocyanate from the viewpoint of the handling property.

((Meth)acrylic Compound)

The (meth)acrylic compound that is reacted with the terminal isocyanate urethane prepolymer is not particularly limited as long as the compound has at least a hydroxyl group and a (meth)acryloyl group in one molecule.

One type of the (meth)acrylic compound may be used singly or two or more types of the (meth)acrylic compounds may be jointly used, and, in a case in which two or more types of the (meth)acrylic compounds are jointly used, the combination and ratio thereof can be arbitrarily selected.

Examples of the (meth)acrylic compound include hydroxyl group-containing (meth)acrylic acid esters such as 2-hydroxyethyle (meth)acrylate, 2-hydroxypropyl (meth)acrylate, 3-hydroxypropyl (meth)acrylate, 2-hyroxybutyl (meth)acrylate, 3-hyroxybuyl (meth)acrylate, 4-hydroxybutyl (meth)acrylate, 4-hydroxycyclohexyl (meth)acrylate, 5-hydroxycyclooxtyl (meth)acrylate, 2-hydroxy-3-phenyloxypropyl (meth)acrylate, pentaerythritol tri(meth)acrylate, polyethylene glycol mono(meth)acrylate, and polypropylene glycol mono(meth)acrylate; hydroxyl group-containing (meth)acrylamides such as N-methylol (meth)acrylamide; reactants obtained by reacting (meth)acrylic acid with vinyl alcohol, vinyl phenol, or bisphenol A glycidyl ether; and the like.

Among these, the (meth)acrylic compound is preferably the hydroxyl group-containing (meth)acrylic acid ester, more preferably a hydroxyl group-containing alkyl (meth)acrylate, and particularly preferably 2-hydroxyethyl (meth)acrylate.

The reaction between the terminal isocyanate urethane prepolymer and the (meth)acrylic compound may be caused using a solvent, a catalyst, and the like as necessary.

Conditions during the reaction between the terminal isocyanate urethane prepolymer and the (meth)acrylic compound may be appropriately adjusted, and, for example, the reaction temperature is preferably 60° C. to 100° C., and the reaction time is preferably one to four hours.

The urethane (meth)acrylate may be any of an oligomer, a polymer and a mixture of an oligomer and a polymer and is preferably an oligomer.

For example, the weight-average molecular weight of the urethane (meth)acrylate is preferably 1,000 to 100,000, more preferably 3,000 to 80,000, and particularly preferably 5,000 to 65,000. When the weight-average molecular weight is 1,000 or more, it becomes easy to optimize the hardness of the first interlayer due to the intermolecular force between structures derived from the urethane (meth)acrylate in polymers of the urethane (meth)acrylate and a polymerizable monomer described below. Meanwhile, in the present specification, unless particularly otherwise described, the weight-average molecular weight refers to a polystyrene-equivalent value measured using gel permeation chromatography (GPC).

[Polymerizable Monomer]

The first interlayer forming composition (II-1) may also contain, in addition to the urethane (meth)acrylate, a polymerizable monomer from the viewpoint of further improving the film-forming property.

The polymerizable monomer refers to polymerizable monomers except for oligomers and polymers which are energy ray-polymerizable and have a weight-average molecular weight of 1,000 or more and is preferably a compound having at least one (meth)acryloyl group in one molecule.

Examples of the polymerizable monomer include alkyl (meth)acrylates in which an alkyl group constituting the alkyl ester has 1 to 30 carbon atoms and has a chain-like shape; functional group-containing (meth)acrylic compounds having a functional group such as a hydroxyl group, an amide group, an amino group, or an epoxy group; (meth)acrylic acid esters having an aliphatic cyclic group; (meth)acrylic acid esters having an aromatic hydrocarbon group; (meth)acrylic acid esters having a heterocyclic group; compounds having a vinyl group; compounds having an allyl group; and the like.

Examples of the alkyl (meth)acrylates having a chain-like alkyl group having 1 to 30 carbon atoms include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, n-octyl (meth)acrylate, isooctyl (meth)acrylate, 2-ethylhexyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, octadecyl (meth)acrylate (stearyl (meth)acrylate), isooctadecyl (meth)acrylate (isostearyl (meth)acrylate), nonadecyl (meth)acrylate, icosyl (meth)acrylate, and the like.

Examples of functional group-containing (meth)acrylic derivatives include hydroxyl group-containing (meth)acrylic acid esters such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; (meth)acrylamides such as (meth)acrylamide, N,N-dimethyl (meth)acrylamide, N-butyl (meth)acrylamide, N-methylol (meth)acrylamide, N-methylolpropane (meth)acrylamide, N-methoxymethyl (meth)acrylamide, and N-butoxymethyl (meth)acrylamide and derivatives thereof; (meth)acrylic acid esters having an amino group (hereinafter, in some cases, referred to as "the amino group-containing (meth) acrylic acid esters"); (meth)acrylic acid esters having a monosubstituted amino group which are formed by substituting one hydrogen atom in an amino group with a group other than a hydrogen atom (hereinafter, in some cases, referred to as "the monosubstituted amino group-containing (meth)acrylic acid esters"); (meth)acrylic acid esters having a disubstituted amino group which are formed by substituting two hydrogen atoms in an amino group with groups other than a hydrogen atom (hereinafter, in some cases, referred to as "the disubstituted amino group-containing (meth)acrylic acid esters"); (meth)acrylic acid esters having an epoxy group such as glycidyl (meth)acrylate and methyl glycidyl (meth)acrylate (hereinafter, in some cases, referred to as "the epoxy group-containing (meth)acrylic acid esters"); and the like.

Here, "the amino group-containing (meth)acrylic acid ester" refers to a compound formed by substituting one or more hydrogen atoms in a (meth)acrylic acid ester with an amino group ($-NH_2$). Similarly, "the monosubstituted amino group-containing (meth)acrylic acid ester" refers to a compound formed by substituting one or more hydrogen atoms in a (meth)acrylic acid ester with a monosubstituted amino group, and "the disubstituted amino group-containing (meth)acrylic acid ester" refers to a compound formed by substituting one or more hydrogen atoms in a (meth)acrylic acid ester with a disubstituted amino group.

Examples of the group other than a hydrogen atom which substitutes the hydrogen atom (that is, the substituent) in "the monosubstituted amino group" and "the disubstituted amino group" include alkyl groups and the like.

Examples of the (meth)acrylic acid esters having an aliphatic cyclic group include isobornyl (meth)acrylate, dicyclopentenyl (meth)acrylate, dicyclopentanyl (meth) acrylate, dicyclopentenyloxyethyl (meth)acrylate, cyclohexyl (meth)acrylate, adamantyl (meth)acrylate, and the like.

Examples of the (meth)acrylic acid esters having an aromatic hydrocarbon group include phenyl hydroxypropyl (meth)acrylate, benzyl (meth)acrylate, 2-hyroxy-3-phenoxypropyl (meth)acrylate, and the like.

The heterocyclic group in the (meth)acrylic acid ester having a heterocyclic group may be any of an aromatic heterocyclic group and an aliphatic heterocyclic group.

Examples of the (meth)acrylic acid esters having a heterocyclic group include tetrahydrofurfuryl (meth)acrylate, (meth)acryloyl morpholine, and the like.

Examples of the compounds having a vinyl group include styrene, hydroxyethyl vinyl ether, hydroxybutyl vinyl ether, N-vinylformamide, N-vinylpyrrolidone, N-vinylcaprolactam, and the like.

Examples of the compounds having an allyl group include allyl glycidyl ethers and the like.

From the viewpoint of good compatibility with the urethane (meth)acrylate, the polymerizable monomer preferably has a relatively bulky group.

Examples of the polymerizable monomer include (meth)acrylic acid esters having an aliphatic cyclic group, (meth)acrylic acid esters having an aromatic hydrocarbon group, and (meth)acrylic acid esters having a heterocyclic group, and (meth)acrylic acid esters having an aliphatic cyclic group are more preferred.

The first interlayer forming composition (II-1) may contain only one type or two or more types of the polymerizable monomers, and, in a case in which the first interlayer forming composition (II-1) contains two or more types of the polymerizable monomers, the combination and ratio thereof can be arbitrarily selected.

In the first interlayer forming composition (II-1), the amount of the polymerizable monomer is preferably 10% to 99% by mass, more preferably 15% to 95% by mass, still more preferably 20% to 90% by mass, and particularly preferably 25% to 80% by mass.

[Photopolymerization Initiator]

The first interlayer forming composition (II-1) may also contain, in addition to the urethane (meth)acrylate and the polymerizable monomer, a photopolymerization initiator. The first interlayer forming composition (II-1) containing the photopolymerization initiator sufficiently proceeds with a curing reaction even when irradiated with energy rays having a relatively low energy such as ultraviolet rays.

Examples of the photopolymerization initiator in the first interlayer forming composition (II-1) include the same photopolymerization initiators as those in the first pressure-sensitive adhesive composition (I-1).

The first interlayer forming composition (II-1) may contain only one type or two or more types of the photopolymerization initiators, and, in a case in which the first interlayer forming composition (II-1) contains two or more types of the photopolymerization initiators, the combination and ratio thereof can be arbitrarily selected.

In the first interlayer forming composition (II-1), the amount of the photopolymerization initiator is preferably 0.01 to 20 parts by mass, more preferably 0.03 to 10 parts by mass, and particularly preferably 0.05 to 5 parts by mass with respect to the total amount (100 parts by mass) of the urethane (meth)acrylate and the polymerizable monomer.

[Resin Components Other than Urethane (Meth)Acrylate]

The first interlayer forming composition (II-1) may also contain resin components other than the urethane (meth)acrylate as long as the effects of the present invention are not impaired.

The types of the resin components and the amount thereof in the first interlayer forming composition (II-1) may be appropriately selected depending on the purpose and are not particularly limited.

[Other Additives]

The first interlayer forming composition (II-1) may also contain other additives which do not correspond to any of the above-described components as long as the effects of the present invention are not impaired.

Examples of the other additives include a variety of well-known additives such as a crosslinking agent, an antistatic agent, an antioxidant, a chain transfer agent, a softening agent (plasticizer), a filler, an antirust agent, and a colorant (a pigment or a dye).

Examples of the chain transfer agent include thiol compounds having at least one thiol group (mercapto group) in one molecule.

Examples of the thiol compounds include nonyl mercaptan, 1-dodecanethiol, 1,2-ethanedithiol, 1,3-propandithiol, triazinethiol, triazinedithiol, triazinetrithiol, 1,2,3-propanetrithiol, tetraethylene glycol bis(3-mercaptopropionate), trimethylolpropane tris(3-mercaptopropionate), pentaerythritol tetrakis(3-mercaptopropionate), pentaerythritol tetrakisthioglycolate, dipentaerythritol hexakis(3-mercaptopropionate), tris[(3-mercaptopropioniloxy)-ethyl]-isocyanurate, 1,4-bis(3-mercaptobutyryloxy)butane, pentaerythritol tetrakis(3-mercaptobutylate), 1,3,5-tris(3-mercaptobutyloxyethyl)-1,3,5-triazine-2,4,6-(1H,3H,5H)-trione, and the like.

The first interlayer forming composition (II-1) may contain only one type or two or more types of the other additives, and, in a case in which the first interlayer forming composition contains two or more types of the other additives, the combination and ratio thereof can be arbitrarily selected.

In the first interlayer forming composition (II-1), the amount of the other additives is not particularly limited and may be appropriately selected depending on the type of the additives.

[Solvent]

The first interlayer forming composition (II-1) may also contain a solvent.

When the first interlayer forming composition (II-1) contains a solvent, the coating aptitude to a coating target surface improves.

<<Method for Manufacturing First Interlayer Forming Composition>>

The first interlayer forming composition such as the first interlayer forming composition (II-1) can be obtained by blending individual components for constituting the first interlayer forming composition.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

Curable Resin layer

The curable resin layer (curable resin film) is a layer for protecting a circuit surface of the semiconductor wafer and bumps provided on the circuit surface. The curable resin layer may be any one of a thermosetting resin layer (thermosetting resin film), and an energy ray-curable resin layer (energy ray-curable resin film). The curable resin layer forms the first protective film by curing.

In the present invention, as described above, since the cured material of the curable resin layer, that is, the first protective film at the time of the dicing has the Young's modulus of equal to or greater than 0.02 MPa, and the tack peak load of equal to or less than 500 g, the attachment of the cutting wastes derived from the first protective film is suppressed on to the side surface of the semiconductor chip when the first protective film is cut together with the semiconductor wafer through the dicing.

A method of dicing capable of obtaining such effects of the present invention is not particularly limited as long as it is a known method, and examples thereof include a method of forming a modified layer in the inside of the stacked body of the semiconductor wafer and the first protective film by being irradiated with laser beam, and then cutting the stacked body in a portion in which the modified layer is formed by applying force to the stacked body. Here, from the viewpoint that the effect of the present invention is most remarkably obtained, it is preferable that the dicing method is a method of cutting the stacked body with a dicing blade.

The conditions of dicing in a case of using the dicing blade may be appropriately adjusted, and the thickness of the dicing blade is preferably 15 to 100 µm, and is more preferably 25 to 50 µm.

A feed speed of the dicing blade (that is, a movement speed of the dicing blade at the time of cutting with the dicing blade) is preferably 5 to 150 mm/sec, and is more preferably 20 to 100 mm/sec.

The number of revolutions of the dicing blade is preferably 15,000 to 60,000 rpm, and more preferably 20,000 to 40,000 rpm.

The dicing conditions described above are particularly preferable when the thickness of the curable resin layer is within a numerical range described later.

Figure 5:
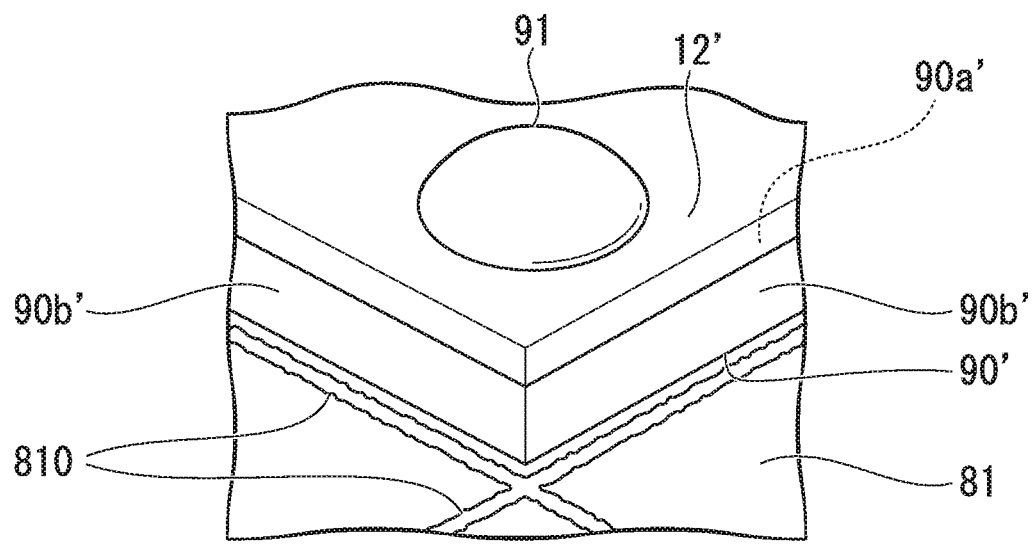
FIG. 5 is an enlarged perspective view schematically showing an example of a semiconductor chip after dicing in a case of using the first protective film forming sheet of the present invention.

FIG. 5 is an enlarged perspective view schematically showing an example of the semiconductor chip obtained by dicing the semiconductor wafer together with the first protective film by using the dicing blade after forming the first protective film on the bump-formed surface of the semiconductor wafer by using the first protective film forming sheet of the present invention. Meanwhile, in FIG. 5, the same constituent element as in FIG. 1 is given the same reference sign as in FIG. 1 and will not be described in detail. What has been described above is also true for FIG. 6 and the subsequent drawings.

As described here, a semiconductor chip 90' is provided with a bump 91 on a circuit surface 90a' thereof, and a first protective film 12' is provided so as to embed the bump 91 by covering a base portion of the portion in the vicinity of the circuit surface 90a' of the bump 91.

The semiconductor chip 90' is held on a pressure-sensitive adhesive layer 81 of the dicing sheet, and a plurality of grooves 810 are formed on the first pressure-sensitive adhesive layer 81 by the dicing blade at the time of the dicing.

A side surface 90b' of the semiconductor chip 90' is a cut surface by dicing, and the cutting wastes of the first protective film 12' are not attached thereto.

Note that, in FIG. 5, in order to make the side surface 90b' of the semiconductor chip 90' easier to see, illustration of other semiconductor chips adjacent to the semiconductor chip 90' is omitted.

Figure 6:
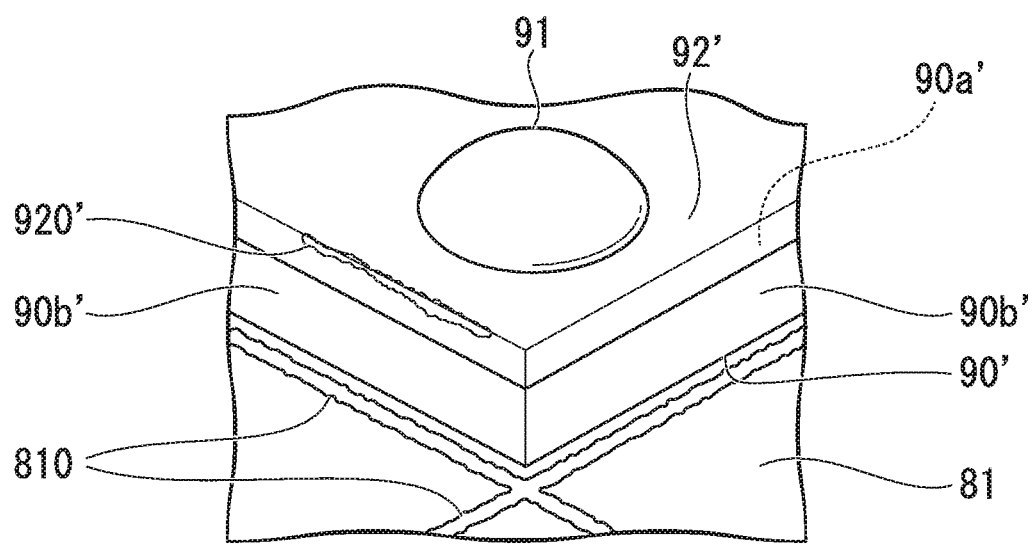
FIG. 6 is an enlarged perspective view schematically showing an example of a semiconductor chip after dicing in a case of using a first protective film forming sheet of the related art.

On the other hand, FIG. 6 is an enlarged perspective view schematically showing an example of the semiconductor chip obtained by dicing the semiconductor wafer together with the protective film by using the dicing blade after forming the protective film on the bump-formed surface of the semiconductor wafer by using the conventional protective film forming sheet. Meanwhile, in FIG. 6, the same constituent element as in FIG. 5 is given the same reference sign as in FIG. 5 and will not be described in detail.

As described here, when the protective film 92' is formed by using the conventional protective film forming sheet, cutting wastes 920' of the protective film 92' are attached to the side surface 90b' of the semiconductor chip 90' by dicing. Note that, the attachment state of the cutting waste of the protective film to the side surface of the semiconductor chip is not limited to the one described here, and various attachment states can be taken depending on the dicing conditions.

In the present invention, the Young's modulus of the of the cured material of the curable resin layer is equal to or greater than 0.02 MPa, preferably 0.02 to 8,000 MPa, more preferably 1 to 7,000 MPa, still more preferably 5 to 6,500 MPa, and for example, may be any one of 10 to 6,000 MPa and 100 to 5,000 MPa. By using the first protective film having the Young's modulus of equal to or greater than the above-described lower limit value at the time of dicing, the first protective film is easily cut when cutting the first protective film by dicing, so that tearing of the first protective film is suppressed, and a high effect of suppressing generation of cutting waste derived from the first protective film is obtained. In addition, by using the first protective film having the Young's modulus of equal to or lower than the upper limit value at the time of dicing, deterioration of adhesiveness of the first protective film due to excessive hardness of the first protective film, warpage of the semiconductor wafer or the semiconductor chip after forming the first protective film, deterioration of reliability of the semiconductor package, and the like are suppressed.

In the present invention, the Young's modulus of the cured material of the curable resin layer can be measured based on JIS K 7127, and the initial elastic modulus measured by using the test piece of the cured material whose temperature is at 80° C. can be adopted as the Young's modulus.

In the present invention, the tack peak load of the cured material of the curable resin layer is equal to or less than 500 g, preferably 0 to 500 g, and more preferably 0 to 250 g, still more preferably 0 to 120 g, and particularly preferably 0 to 50 g. By using the first protective film having the tack peak load of equal to or lower than the upper limit value at the time of the dicing, even when the cutting wastes of the first protective film are generated at the time of cutting the first protective film by dicing, a high effect of suppressing the attachment of the cutting wastes on the side surface of the semiconductor chip is obtained. For example, in a case of dicing using the dicing blade, the attachment of the cutting wastes of the first protective film on the dicing blade is suppressed, and as a result, the attachment of the cutting wastes on the side surface of the semiconductor chip is suppressed. The lower limit value of the tack peak load is not particularly limited, and even when it is 0 g, the effect of the present invention is not impaired and the other physical properties of the first protective film can be sufficiently adjusted within a preferable range.

In the present invention, the tack peak load of the cured material of the curable resin layer can be measured by using a tacking tester with a method described in examples, which will be described later. That is, one surface of the test piece of the cured material was directed upward, and a metal plate at 80° C. is plated on the aforementioned surface, a load of 100 gf (0.98 N) was applied to the test piece by pressing a stainless steel probe at 80° C. from the lower side to the other surface (that is, the measurement surface of the peak load) of the test piece facing downward, 60 seconds after the load was applied, the probe was lowered at a speed of 600 mm/min, and thereby a peak load measured when peeled from the test piece can be adopted as the tack peak load.

In the present invention, in one embodiment of the cured material of the curable resin layer (the first protective film), for example, it is preferable that the Young's modulus is 0.02 to 8,000 MPa, and the tack peak load is 0 to 500 g, it is more preferable that the Young's modulus is 0.02 to 8,000 MPa, and the tack peak load is 0 to 250 g, it is still more preferable that the Young's modulus is 0.02 to 8,000 MPa, and the tack peak load is 0 to 120 g, and it is particularly preferable that the Young's modulus is 0.02 to 8,000 MPa, and the tack peak load is 0 to 50 g.

In the cured material, further, the Young's modulus is more preferably 1 to 7,000 MPa, still more preferably 5 to 6,500 MPa, and for example, may be any one of 10 to 6,000 MPa and 100 to 5,000 MPa.

In the present invention, in one embodiment of the cured material of the curable resin layer (the first protective film), for example, the Young's modulus is 1 to 7,000 MPa, and the tack peak load is preferably 0 to 500 g, the Young's modulus is 5 to 6,500 MPa, and the tack peak load is more preferably 0 to 500 g, for example, the Young's modulus may be 10 to 6,000 MPa, and the tack peak load may be 0 to 500 g, and the Young's modulus may be 100 to 5,000 MPa, and the tack peak load may be 0 to 500 g.

In the cured material, further, the tack peak load is more preferably 0 to 250 g, still more preferably 0 to 120 g, and particularly preferably 0 to 50 g.

The protective film formed on the bump-formed surface of the semiconductor wafer, such as the first protective film of the present invention, is usually thinner than the pressure-sensitive adhesive layer constituting the dicing sheet, and its constituent material is also different. The pressure-sensitive adhesive layer in the dicing sheet is required to stably hold the semiconductor wafer as an object to be attached at the time of dicing and at the time of dicing, the pressure-sensitive adhesive layer in contact with the dicing blade in a state of being pressed by the semiconductor wafer from the side on which the dicing blade is arranged. On the other hand, the protective film is not required to hold the semiconductor wafer as an object to be attached, but to protect the circuit surface and the bump of the semiconductor wafer, and at the time of dicing, the dicing blade is in directly contact with the protective film. As described above, the protective film and the pressure-sensitive adhesive layer in the dicing sheet are different from each other in the purpose and the contacting form with the dicing blade, so that it can be said it is natural that the thickness and the constituent material are different as described above. In addition, the first protective film of the present invention has a basic function as the protective film, and as described above, has a configuration in which the attachment of the cutting wastes on the side surface of the semiconductor chip at the time of dicing is suppressed, and has different purpose and configuration from those of the pressure-sensitive adhesive layer in the conventional dicing sheet.

The Young's modulus and the tack peak load of the cured material can be adjusted by adjusting the kinds of the curable resin layers.

The curable resin layer can be formed using a curable resin layer forming composition containing a constituent material thereof.

Accordingly, the Young's modulus and the tack peak load of the cured material can be adjusted by adjusting one or both of the kind and the amount of the contained components of the curable resin layer forming composition.

The curable resin layer forming composition (thermosetting resin layer forming composition, the energy ray-curable resin layer forming composition), and the manufacturing method thereof will be specifically described below.

Thermosetting Resin Layer

Examples of a preferred thermosetting resin layer include thermosetting resin layers containing a polymer component (A) and a thermosetting component (B). The polymer component (A) is a component considered to be formed by a polymerization reaction of a polymerizable compound. In addition, the thermosetting component (B) is a component capable of a curing (polymerization) reaction using heat as a trigger of the reaction. Meanwhile, in the present invention, a polycondensation reaction is also considered to be the polymerization reaction.

The thermosetting resin layer may be a single layer (monolayer) or a plurality of layers of two or more layers, and, in a case in which the thermosetting resin layer is a plurality of layers, the respective layers in the plurality of layers may be identical to or different from one another, and the combination of the plurality of layers is not particularly limited.

The thickness of the thermosetting resin layer is preferably 1 to 100 μm, more preferably 5 to 90 μm, and particularly preferably 5 to 80 μm. When the thickness of the thermosetting resin layer is equal to or more than the lower limit value, it is possible to form the first protective film having a higher protection function. In addition, when the thickness of the thermosetting resin layer is equal to or less than the upper limit value, excessive thickness is suppressed.

Here, "the thickness of the thermosetting resin layer" refers to the thickness of the entire thermosetting resin layer, and, for example, the thickness of the thermosetting resin layer made up of a plurality of layers refers to the total thickness of all of the layers constituting the thermosetting resin layer.

The curing conditions when the thermosetting resin layer is attached to the bump-formed surface of the semiconductor wafer, and is cured so as to form the first protective film are not particularly limited as long as the first protective film has sufficient hardness so as to exert its function, and may be appropriately selected according to the kinds of the thermosetting resin layers.

For example, the heating temperature at the time of the curing of the thermosetting resin layer is preferably 100° C. to 200° C., more preferably 110° C. to 180° C., and particularly preferably 120° C. to 170° C. In addition, the heating time for the curing is preferably 0.5 to five hours, more preferably 0.5 to three hours, and particularly preferably one to two hours.

<<Thermosetting Resin Layer Forming Composition>>

The thermosetting resin layer can be formed using a thermosetting resin layer forming composition containing a constituent material thereof. For example, the thermosetting resin layer can be formed at an intended portion by applying the thermosetting resin layer forming composition to a target surface on which the thermosetting resin layer is to be formed and drying the thermosetting resin layer forming composition as necessary. The ratio between the amounts of components, which do not gasify at normal temperature, in the thermosetting resin layer forming composition is, generally, identical to the ratio between the amounts of the above-described components in the thermosetting resin layer. Here, "normal temperature" is as described above.

The thermosetting resin layer forming composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the thermosetting resin layer forming composition are not particularly limited; however, in a case in which the thermosetting resin layer forming composition contains a solvent described below, the thermosetting resin layer forming composition is preferably heated and dried. The thermosetting resin layer forming composition containing a solvent is preferably dried at 70° C. to 130° C. for 10 seconds to 5 minutes.

<Resin Layer Forming Composition (III-1)>

Examples of the thermosetting resin layer forming composition include a thermosetting resin layer forming composition (III-1) containing the polymer component (A) and the thermosetting component (B) (in the present specification, in some cases, simply abbreviated as "the resin layer forming composition (III-1)") and the like.

[Polymer Component (A)]

The polymer component (A) is a polymer compound for imparting a film-forming property, flexibility, and the like to the thermosetting resin layer.

The resin layer forming composition (III-1) and the thermosetting resin layer may contain only one type or two or more types of the polymer components (A), and, in a case in which the resin layer forming composition and the thermosetting resin layer contain two or more types of the polymer components, the combination and ratio thereof can be arbitrarily selected.

Examples of the polymer component (A) include acrylic resins (resins having a (meth)acryloyl group), polyesters, urethane-based resins (resins having a urethane bond), acrylic urethane resins, silicone-based resins (resin having a siloxane bond), rubber-based resins (resins having a rubber structure), phenoxy resins, thermosetting polyimides, and the like, and acrylic resins are preferred.

Examples of the acrylic resin in the polymer component (A) include well-known acrylic polymers.

The weight-average molecular weight (Mw) of the acrylic resin is preferably 10,000 to 2,000,000 and more preferably 100,000 to 1,500,000. When the weight-average molecular weight of the acrylic resin is equal to or more than the lower limit value, the shape stability (aging stability during storage) of the thermosetting resin layer improves. In addition, when the weight-average molecular weight of the acrylic resin is equal to or less than the upper limit value, it becomes easy for the thermosetting resin layer to follow the uneven surfaces of adherends, and the generation of voids and the like between an adherend and the thermosetting resin layer is further suppressed.

The glass transition temperature (Tg) of the acrylic resin is preferably −60° C. to 70° C. and more preferably −30° C. to 50° C. When the Tg of the acrylic resin is equal to or higher than the lower limit value, the adhesive force between the first protective film and the first supporting sheet is suppressed, and thus the peeling property of the first supporting sheet improves. In addition, when the Tg of the acrylic resin is equal to or lower than the upper limit value, the adhesive force of the thermosetting resin layer and the first protective film to adherends improves.

Examples of the acrylic resin include polymers of one or more type of (meth)acrylic acid esters; copolymers of two or more types of monomers selected from (meth)acrylic acid, itaconic acid, vinyl acetate, acrylonitrile, styrene, N-methylol acrylamide, and the like; and the like.

Examples of the (meth)acrylic acid esters constituting the acrylic resin include alkyl (meth)acrylic esters in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, and octadecyl (meth)acrylate (stearyl (meth)acrylate) and the like;

cycloalkyl (meth)acrylic acid esters such as isobornyl (meth)acrylate and dicyclopentanyl (meth)acrylate;

aralkyl (meth)acrylic acid esters such as benzyl (meth)acrylate;

cycloalkenyl (meth)acrylic acid esters such as dicyclopentenyl (meth)acrylate;

cycloalkenyloxy alkyl (meth)acrylic acid esters such as dicyclopentenyloxyethyl (meth)acrylate;

imide (meth)acrylate;

glycidyl group-containing (meth)acrylic acid esters such as glycidyl (meth)acrylate;

hydroxyl group-containing (meth)acrylic acid esters such as hydroxymethyl (meth)acrylate, 2-hydroxyethyl (meth)acrylate, 2-hydroxypropyl (meth)acrylate, 3-hydroxypropyl (meth)acrylate, 2-hydorybutyl (meth)acrylate, 3-hydroxybutyl (meth)acrylate, and 4-hydroxybutyl (meth)acrylate; and substituted amino group-containing (meth)acrylic acid esters such as N-methylaminoethyl (meth)acrylate; and the like. Here, "the substituted amino group" refers to a group formed by substituting one or two hydrogen atoms in an amino group with a group other than a hydrogen atom.

The acrylic resin may be, for example, in addition to the (meth)acrylic acid ester, a resin formed by the copolymerization of one or more types of monomers selected from (meth)acrylic acid, itaconic acid, vinyl acetate, acrylonitrile, styrene, N-methylol acrylamide, and the like.

The acrylic resin may be constituted of only one type or two or more types of monomers, and, in a case in which the acrylic resin is constituted of two or more types of monomers, the combination and ratio thereof can be arbitrarily selected.

The acrylic resin may also have a functional group capable of bonding to other compounds such as a vinyl group, a (meth)acryloyl group, an amino group, a hydroxyl group, a carboxy group, or an isocyanate group. The functional group in the acrylic resin may be bonded to other compounds through a crosslinking agent (F) described below or may be directly bonded to other compounds without the crosslinking agent (F). When the acrylic resin is bonded to other compounds through the functional group, there is a tendency that the reliability of packages obtained using the first protective film forming sheet improves.

In the present invention, as the polymer component (A), a thermoplastic resin other than the acrylic resin (hereinafter, in some cases, simply abbreviated as "the thermoplastic resin") may be used singly without using the acrylic resin or may be jointly used with the acrylic resin. When the thermoplastic resin is used, there are cases in which the peeling property of the first protective film from the first supporting sheet improves, it becomes easy for the thermosetting resin layer to follow the uneven surfaces of adherends, and the generation of voids and the like between an adherend and the thermosetting resin layer is further suppressed.

The weight-average molecular weight of the thermoplastic resin is preferably 1,000 to 100,000 and more preferably 3,000 to 80,000.

The glass transition temperature (Tg) of the thermoplastic resin is preferably −30° C. to 150° C. and more preferably −20° C. to 120° C.

Examples of the thermoplastic resin include polyesters, polyurethanes, phenoxy resins, polybutene, polybutadienes, polystyrenes, and the like.

The resin layer forming composition (III-1) and the thermosetting resin layer may contain only one type or two or more types of the thermoplastic resins, and, in a case in which the resin layer forming composition and the thermosetting resin layer contains two or more types of the thermoplastic resins, the combination and ratio thereof can be arbitrarily selected.

In the resin layer forming composition (III-1), the ratio of the amount of the polymer component (A) (that is, the amount of the polymer component (A) in the thermosetting resin layer) with respect to the total amount of all of the components other than the solvent is preferably 5% to 85% by mass and more preferably 5% to 80% by mass regardless of the type of the polymer component (A).

There are cases in which the polymer component (A) corresponds to the thermosetting component (B). In the present invention, in a case in which the resin layer forming composition (III-1) contains components corresponding to both the polymer component (A) and the thermosetting component (B) as described above, the resin layer forming composition (III-1) is considered to contain the polymer component (A) and the thermosetting component (B).

[Thermosetting Component (B)]

The thermosetting component (B) is a component for curing the thermosetting resin layer so as to form a rigid first protective film.

The resin layer forming composition (III-1) and the thermosetting resin layer may contain only one type or two or more types of the thermosetting components (B), and, in a case in which the resin layer forming composition and the thermosetting resin layer contains two or more types of the thermosetting components, the combination and ratio thereof can be arbitrarily selected.

Examples of the thermosetting component (B) include epoxy-based thermosetting resins, thermosetting polyimides, polyurethanes, unsaturated polyesters, silicone resins, and the like, and epoxy-based thermosetting resins are preferred.

(Epoxy-Based Thermosetting Resin)

The epoxy-based thermosetting resin is made up of an epoxy resin (B1) and a thermal curing agent (B2).

The resin layer forming composition (III-1) and the thermosetting resin layer may contain only one type or two or more types of the epoxy-based thermosetting resins, and, in a case in which the resin layer forming composition and the thermosetting resin layer contains two or more types of the epoxy-based thermosetting resins, the combination and ratio thereof can be arbitrarily selected.

Epoxy Resin (B1)

As the epoxy resin (B1), well-known epoxy resins can be exemplified. Examples thereof include polyfunctional epoxy resins, biphenyl compounds, bisphenol A diglycidyl ethers and hydrogenated substances thereof, orthocresol novolac epoxy resins, dicyclopentadiene-type epoxy resins, biphenyl-type epoxy resins, bisphenol A-type epoxy resins, bisphenol F-type epoxy resins, phenylene skeleton-type epoxy resins, and the like, and di- or higher-functional epoxy compounds.

As the epoxy resin (B1), an epoxy resin having an unsaturated hydrocarbon group may also be used. The epoxy resin having an unsaturated hydrocarbon group has more favorable compatibility with acrylic resins than epoxy resins not having an unsaturated hydrocarbon group. Therefore, when the epoxy resin having an unsaturated hydrocarbon group is used, the reliability of packages obtained using the first protective film forming sheet improves.

Examples of the epoxy resin having an unsaturated hydrocarbon group include compounds formed by converting a part of epoxy groups in a polyfunctional epoxy resin to groups having an unsaturated hydrocarbon group. The above-described compound can be obtained by, for example, an addition reaction of (meth)acrylic acid or a derivative thereof to an epoxy group.

In addition, examples of the epoxy resin having an unsaturated hydrocarbon group include compounds in which a group having an unsaturated hydrocarbon group is directly bonded to an aromatic ring or the like constituting an epoxy resin and the like.

The unsaturated hydrocarbon group is a polymerizable unsaturated group, and specific examples thereof include ethenyl groups (vinyl groups), 2-propenyl group (allyl group), (meth)acryloyl groups, (meth)acrylamide groups, and the like, and acryloyl groups are preferred.

The number-average molecular weight of the epoxy resin (B1) is not particularly limited, but is preferably 300 to 30,000, more preferably 400 to 10,000, and particularly preferably 500 to 3,000 from the viewpoint of the curing property of the thermosetting resin layer and the strength and thermal resistance of the first protective film after curing.

The epoxy equivalent of the epoxy resin (B1) is preferably 100 to 1,000 g/eq and more preferably 300 to 800 g/eq.

One type of the epoxy resin (B1) may be used singly or two or more types thereof may be jointly used, and, in a case in which two or more types thereof are jointly used, the combination and ratio thereof can be arbitrarily selected.

Thermosetting Agent (B2)

The thermal curing agent (B2) functions as a curing agent of the epoxy resin (B1).

Examples of the thermal curing agent (B2) include compounds having two or more functional groups capable of reacting with an epoxy group in one molecule. Examples of the functional group include phenolic hydroxyl groups, alcoholic hydroxyl groups, an amino group, a carboxy group, groups in which an acid group is turned into an anhydride, and the like, phenolic hydroxyl groups, amino groups, or groups in which an acid group is turned into an anhydride are preferred, and phenolic hydroxyl groups or amino groups are more preferred.

As the thermal curing agent (B2), examples of phenolic curing agents having a phenolic hydroxyl group include polyfunctional phenolic resins, biphenol, novolac-type phenolic resins, dicyclopentadiene-based phenolic resins, aralkylphenolic resins, and the like.

As the thermal curing agent (B2), examples of amine-based curing agents having an amino group include dicyandiamide (hereinafter, in some cases, abbreviated as "DICY"), and the like.

The thermal curing agent (B2) may also have an unsaturated hydrocarbon group.

Examples of the thermal curing agent (B2) having an unsaturated hydrocarbon group include compounds formed by substituting a part of hydroxyl groups in a phenolic resin with groups having an unsaturated hydrocarbon group, compounds formed by directly bonding a group having an unsaturated hydrocarbon group to an aromatic ring of a phenolic resin, and the like.

The unsaturated hydrocarbon group in the thermal curing agent (B2) is identical to the unsaturated hydrocarbon group in the above-described epoxy resin having an unsaturated hydrocarbon group.

In a case in which a phenolic curing agent is used as the thermal curing agent (B2), the thermal curing agent (B2) preferably has a high softening point or glass transition temperature since the peeling property from the first supporting sheet of the first protective film improves.

The number-average molecular weight of the resin component such as a polyfunctional phenolic resin, a novolac-type phenolic resin, a dicyclopentadiene-based phenolic resin, or an aralkylphenolic resin as the thermal curing agent (B2) is preferably 300 to 30,000, more preferably 400 to 10,000, and particularly preferably 500 to 3,000.

The molecular weight of a non-resin component, for example, biphenol or dicyandiamide as the thermal curing agent (B2) is not particularly limited, and is preferably, for example, 60 to 500.

One type of the thermal curing agent (B2) may be used singly or two or more types thereof may be jointly used, and, in a case in which two or more types thereof are jointly used, the combination and ratio thereof can be arbitrarily selected.

In the resin layer forming composition (III-1) and the thermosetting resin layer, the amount of the thermal curing agent (B2) is preferably 0.1 to 500 parts by mass, more preferably 1 to 200 parts by mass, and may be, for example, any one of 5 to 150 parts by mass, and 10 to 100 parts by mass with respect to the amount (100 parts by mass) of the epoxy resin (B1). When the amount of the thermal curing agent (B2) is equal to or more than the lower limit value, it becomes easier for the curing of the thermosetting resin layer to proceed. In addition, when the amount of the thermal curing agent (B2) is equal to or less than the upper limit value, the moisture absorptivity of the thermosetting resin layer is decreased, and thus the reliability of packages obtained by using the first protective film forming sheet further improves.

In the resin layer forming composition (III-1) and the thermosetting resin layer, the amount of the thermosetting component (B) (for example, the total amount of the epoxy resin (B1) and the thermal curing agent (B2)) is preferably 10 to 1,000 parts by mass, more preferably 20 to 1,000 parts by mass, and may be, for example, any one of 50 to 1,000 parts by mass, 100 to 900 parts by mass, and 150 to 800 parts by mass with respect to the amount (100 parts by mass) of the polymer component (A). When the amount of the thermosetting component (B) is in the above-described range, the adhesive force between the first protective film and the first supporting sheet is suppressed, and thus the peeling property of the first supporting sheet improves.

[Curing Accelerator (C)]

The resin layer forming composition (III-1) and the thermosetting resin layer may also contain a curing accelerator (C). The curing accelerator (C) is a component for adjusting the speed of curing the resin layer forming composition (III-1).

Examples of preferred curing accelerators (C) include tertiary amines such as triethylene diamine, benzyldimethylamine, triethanolamine, dimethylaminoethanol, and tris(dimethylaminomethyl)phenol; imidazoles (imidazoles in which one or more hydrogen atoms are substituted with groups other than a hydrogen atom) such as 2-methylimidazole, 2-phenyl imidazole, 2-phenyl-4-methylimidazole, 2-phenyl-4,5-dihydroxymethylimidazole, and 2,-phenyl-4-methyl-5-hydroxymethylimidazole; organic phosphines (phosphines in which one or more hydrogen atoms are substituted with organic groups) such as tributyl phosphine, diphenyl phosphine, and triphenyl phosphine; tetraphenyl boron salts such as tetraphenyl phosphonium tetraphenyl borate and triphenyl phosphine tetraphenyl borate; and the like.

The resin layer forming composition (III-1) and the thermosetting resin layer may contain only one type or two or more types of the curing accelerator (C), and, in a case in which the resin layer forming composition and the thermosetting resin layer contains two or more types of the thermosetting components, the combination and ratio thereof can be arbitrarily selected.

In a case in which the curing accelerator (C) is used, in the resin layer forming composition (III-1) and the thermosetting resin layer, the amount of the curing accelerator (C) is preferably 0.01 to 10 parts by mass and more preferably 0.1 to 5 parts by mass of the amount (100 parts by mass) of the thermosetting component (B). When the amount of the curing accelerator (C) is equal to or more than the lower limit value, the effects of the use of the curing accelerator (C) can be more significantly obtained. In addition, when the amount of the curing accelerator (C) is equal to or less than the upper limit value, for example, an effect of suppressing a highly polar curing accelerator (C) migrating toward the adhesion interface with adherends in the thermosetting resin layer under high temperature and high humidity conditions and segregating becomes significant, and the reliability of packages obtained using the first protective film forming sheet further improves.

[Filler (D)]

The resin layer forming composition (III-1) and the thermosetting resin layer may also contain a filler (D). When the thermosetting resin layer contains the filler (D), the coefficient of thermal expansion of the first protective film obtained by curing the thermosetting resin layer can be easily adjusted. Further, when this coefficient of thermal expansion is optimized for a subject on which the first protective film is to be formed, the reliability of packages obtained using the first protective film forming sheet further improves. In addition, when the thermosetting resin layer contains the filler (D), it is also possible to decrease the moisture absorptivity of the first protective film or improving the heat dissipation property.

The filler (D) may be any one of an organic filler and an inorganic filler, but is preferably an inorganic filler.

Examples of preferred inorganic fillers include powder of silica, alumina, talc, calcium carbonate, titanium white, colcothar, silicon carbide, boron nitride, and the like; beads obtained by spherodizing these inorganic fillers; surface-modified products of these inorganic fillers; single crystal fibers of these inorganic fillers; glass fibers; and the like.

Among these, the inorganic filler is preferably silica or alumina.

The resin layer forming composition (III-1) and the thermosetting resin layer may contain only one type or two or more types of the filler (D), and, in a case in which the resin layer forming composition and the thermosetting resin layer contains two or more types of the filler (D), the combination and ratio thereof can be arbitrarily selected.

In a case in which the filler (D) is used, in the resin layer forming composition (III-1), the ratio of the amount of the filler (D) (that is, the amount of the filler (D) in the thermosetting resin layer) with respect to the total amount of all of the components other than the solvent is preferably 5% to 80% by mass and more preferably 7% to 60% by mass. When the amount of the filler (D) is in the above-described range, the adjustment of the coefficient of thermal expansion becomes easier.

[Coupling Agent (E)]

The resin layer forming composition (III-1) and the thermosetting resin layer may also contain a coupling agent (E). When a coupling agent having a functional group capable of reacting with an inorganic compound or an organic compound is used as the coupling agent (E), it is possible to improve the adhesiveness and adhesion of the thermosetting resin layer to adherends. In addition, when the coupling agent (E) is used, the first protective film obtained by curing the thermosetting resin layer is not impaired in the thermal resistance and is improved in terms of the water resistance.

The coupling agent (E) is preferably a compound having a functional group capable of reacting with the functional group in the polymer component (A), the thermosetting component (B0), or the like and more preferably a silane coupling agent.

Examples of preferred silane coupling agents include 3-glycidyloxypropyltrimethoxysilane, 3-glycidyloxypropyl-methyldiethoxysilane, 3-glycidyloxypropyltriethoxysilane, 3-glycidyloxymethyldiethoxysilane, 2-(3,4-epoxycyclohexyl)ethyltrimethoxysilane, 3-methacryloyloxypropyltrimethoxysilane, 3-aminopropyltrimethoxysilane, 3-(2-aminoethylamino)propyltrimethoxysilane, 3-(2-aminoethylamino)propylmethyldiethoxysilane, 3-(phenylamino)propyltrimethoxysilane, 3-anilinopropyltrimethoxysilane, 3-ureidopropyltrimethoxysilane, 3-mercaptopropyltrimethoxysilane, 3-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane, imidazolesilane, and the like.

The resin layer forming composition (III-1) and the thermosetting resin layer may contain only one type or two or more types of the coupling agents (E), and, in a case in which the resin layer forming composition and the thermosetting resin layer contains two or more types of the coupling agents, the combination and ratio thereof can be arbitrarily selected.

In a case where the coupling agent (E) is used, in the resin layer forming composition (III-1) and the thermosetting resin layer, the amount of the coupling agent (E) is preferably 0.03 to 20 parts by mass, more preferably 0.05 to 10 parts by mass, and particularly preferably 0.1 to 5 parts by mass with respect to the total amount (100 parts by mass of the polymer component (A) and the thermosetting component (B)). When the amount of the coupling agent (E) is equal to or more than the lower limit value, the effects of the use of the coupling agent (E) such as the improvement of the dispersibility of the filler (D) in resins and the improvement of the adhesiveness of the thermosetting resin layer to adherends can be significantly obtained. In addition, when the amount of the coupling agent (E) is equal to or less than the upper limit value, the generation of outgas is further suppressed.

[Crosslinking Agent (F)]

In a case in which a polymer component having a functional group such as a vinyl group, a (meth)acryloyl group, an amino group, a hydroxyl group, a carboxy group, or an isocyanate group which are capable of bonding to other compounds such as the above-described acrylic resin is used as the polymer component (A), the resin layer forming composition (III-1) and the thermosetting resin layer may also contain a crosslinking agent (F). The crosslinking agent (F) is a component for crosslinking the functional group in the polymer component (A) by bonding with the other compound, and the initial adhesive force and the agglomerative force of the thermosetting resin layer can be adjusted by crosslinking in this way.

Examples of the crosslinking agent (F) include organic polyhydric isocyanate compounds, organic polyhydric imine compounds, metal chelate-based crosslinking agents (crosslinking agents having a metal chelate structure), aziridine-based crosslinking agents (crosslinking agents having an aziridinyl group), and the like.

Examples of the organic polyhydric isocyanate compounds include aromatic polyhydric isocyanate compounds, aliphatic polyhydric isocyanate compounds, and alicyclic polyhydric isocyanate compounds (hereinafter, in some cases, these compounds will be collectively abbreviated as "aromatic polyhydric isocyanate compounds and the like"); timers, isocyanurate bodies, and adduct bodies of the aromatic polyhydric isocyanate compounds and the like; terminal isocyanate urethane prepolymers obtained by reacting the aromatic polyhydric isocyanate compounds and the like and a polyol compound. The "adduct body" refers to a reactant of the aromatic polyhydric isocyanate compound, the aliphatic polyhydric isocyanate compound, or the alicyclic polyhydric isocyanate compound and a low-molecular-weight active hydrogen-containing compound such as ethylene glycol, propylene glycol, neopentyl glycol, trimethylolpropane, or castor oil. Examples of the adduct body include xylylene diisocyanate adducts of trimethylolpropane as described below and the like. In addition, "the terminal isocyanate urethane prepolymer" is as described above.

More specific examples of the organic polyhydric isocyanate compound include 2,4-tolylene diisocyanate; 2,6-tolylene diisocyanate; 1,3-xylylene diisocyanate; 1,4-xylylene diisocyanate; diphenylmethane-4,4'-diisocyanate; diphenylmethane-2,4'-diisocyanate; 3-methyldiphenylmethane diisocyanate; hexamethylene diisocyanate; isophorone diisocyanate; dicyclohexylmethane-4,4'-diisocyanate; dicyclohexylmethane-2,4'-diisocyanate; compounds obtained by adding any one or more types of tolylene diisocyanate, hexamethylene diisocyanate, and xylylene diisocyanate to all or some of hydroxyl groups in a polyol such as trimethylolpropane; lysine diisocyanate; and the like.

Examples of the organic polyhydric imine compounds include N,N'-diphenylmethane-4,4'-bis(1-aziridinecarboxamide), trimethylolpropane tri-β-aziridinylpropionate, tetramethylolmethane-tri-β-aziridinylpropionate, N,N'-toluene-2,4-bis(1-aziridinecarboxamide) triethylene melamine, and the like.

In a case in which the organic polyhydric isocyanate compound is used as the crosslinking agent (F), a hydroxyl group-containing polymer is preferably used as the polymer component (A). In a case in which the crosslinking agent (F) has an isocyanate group and the polymer component (A) has a hydroxyl group, it is possible to simply introduce a crosslinking structure into the thermosetting resin layer by a reaction between the crosslinking agent (F) and the polymer component (A).

The resin layer forming composition (III-1) and the thermosetting resin layer may contain only one type or two or more types of the crosslinking agent (F), and, in a case in which the resin layer forming composition (III-1) and the thermosetting resin layer contains two or more types of the thermosetting components, the combination and ratio thereof can be arbitrarily selected.

In a case in which the crosslinking agent (F) is used, in the resin layer forming composition (III-1), the amount of the crosslinking agent (F) is preferably 0.01 to 20 parts by mass, more preferably 0.1 to 10 parts by mass, and particularly preferably 0.5 to 5 parts by mass with respect to the amount (100 parts by mass) of the polymer component (A). When the amount of the crosslinking agent (F) is equal to or more than the lower limit value, the effects of the use of the crosslinking agent (F) can be significantly obtained. In addition, when the amount of the crosslinking agent (F) is equal to or less than the upper limit value, the excess use of the crosslinking agent (F) is suppressed.

[Energy Ray-Curable Resin (G)]

The resin layer forming composition (III-1) may contain an energy ray-curable resin (G). When the thermosetting resin layer contains the energy ray-curable resin (G), it is possible to change the characteristics by being irradiated with energy rays.

The energy ray-curable resin (G) is obtained by polymerizing (curing) an energy ray-curable compound.

Examples of the energy ray-curable compound include compounds having at least one polymerizable double bond in the molecule, and acrylate-based compounds having a (meth)acryloyl group are preferred.

Examples of the acrylate-based compounds include chain-like aliphatic skeleton-containing (meth)acrylates such as trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butylene glycol di(meth)acrylate, and 1,6-hexanediol di(meth)acrylate; cyclic aliphatic skeleton-containing (meth)acrylates such as dicyclopentanyl di(meth)acrylate; polyalkylene glycol (meth)acrylates such as polyethylene glycol di(meth)acrylate; oligo ester (meth)acrylates; urethane (meth)acrylate oligomers; epoxy-modified (meth)acrylates; polyether (meth)acrylates other than the above-described polyalkylene glycol (meth)acrylates; itaconic acid oligomers; and the like.

The weight-average molecular weight of the energy ray-curable compound is preferably 100 to 30,000 and more preferably 300 to 10,000.

Only one type or two or more types of the energy ray-curable compounds may be used for polymerization, and, in a case in which two or more types of the energy ray-curable compounds are used, the combination and ratio thereof can be arbitrarily selected.

The resin layer forming composition (III-1) may contain only one type or two or more types of the energy ray-curable resins (G), and, in a case in which the resin layer forming composition contains two or more types of the energy ray-curable resins, the combination and ratio thereof can be arbitrarily selected.

In a case of using the energy ray-curable resin (G), the amount of the energy ray-curable resin (G) in the resin layer forming composition (III-1) is preferably 1% to 95% by mass, more preferably 5% to 90% by mass, and particularly preferably 10% to 85% by mass.

[Photopolymerization Initiator (H)]

In the case of containing the energy ray-curable resin (G), the resin layer forming composition (III-1) may also contain a photopolymerization initiator (H) in order to cause the polymerization reaction of the energy ray curable resin (G) to more efficiently proceed.

Examples of the resin layer forming composition (III-1) include the same photopolymerization initiators (H) as those in the first pressure-sensitive adhesive composition (I-1).

The resin layer forming composition (III-1) may contain only one type or two or more types of the photopolymerization initiators (H), and, in a case in which the resin layer forming composition contains two or more types of the photopolymerization initiators, the combination and ratio thereof can be arbitrarily selected.

In a case in which the photopolymerization initiator (H) is used, in the resin layer forming composition (III-1), the amount of the photopolymerization initiators (H) is preferably 0.1 to 20 parts by mass, more preferably 1 to 10 parts by mass, and particularly preferably 2 to 5 parts by mass of the amount (100 parts by mass) of the energy ray-curable resin (G).

[Versatile Additive (I)]

The resin layer forming composition (III-1) and the thermosetting resin layer may also contain a versatile additive (I) as long as the effects of the present invention are not impaired.

The versatile additive (I) may be a well-known versatile additive, can be arbitrarily selected depending on the purpose, and is not particularly limited, and examples of preferred versatile additives include a plasticizer, an antistatic agent, an antioxidant, a colorant (a pigment or a dye), a gettering agent, and the like.

The resin layer forming composition (III-1) and the thermosetting resin layer may contain only one type or two or more types of the versatile additive (I), and, in a case in which the resin layer forming composition and the thermosetting resin layer contains two or more types of the thermosetting components, the combination and ratio thereof can be arbitrarily selected.

The amount of the versatile additive (I) in the resin layer forming composition (III-1) and the thermosetting resin layer is not particularly limited and may be appropriately selected depending on the purpose.

[Solvent]

The resin layer forming composition (III-1) preferably further contains a solvent. The resin layer forming composition (III-1) containing a solvent improves in terms of the handling property.

The solvent is not particularly limited, but preferred examples thereof include hydrocarbons such as toluene and xylene; alcohols such as methanol, ethanol, 2-propanol, isobutyl alcohol (2-methyl propane-1-ol), and 1-butanol; esters such as ethyl acetate; ketones such as acetone and methyl ethyl ketone; ethers such as tetrahydrofuran; amides (compounds having an amide bond) such as dimethyl formamide and N-methyl pyrrolidone, and the like.

The resin layer forming composition (III-1) may contain only one type or two or more types of the solvents, and, in a case in which the resin layer forming composition contains two or more types of the solvents, the combination and ratio thereof can be arbitrarily selected.

The solvent contained in the resin layer forming composition (III-1) is preferably methyl ethyl ketone or the like since it is possible to more uniformly mix the components contained in the resin layer forming composition (III-1).

<<Method for Manufacturing Thermosetting Resin Layer Forming Composition>>

The thermosetting resin layer forming composition such as the resin layer forming composition (III-1) can be obtained by blending individual components for constituting the thermosetting resin layer forming composition.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

Energy Ray-Curable Resin Layer

The energy ray-curable resin layer contains an energy ray-curable component (a).

The energy ray-curable component (a) is preferably uncured and is preferably pressure-sensitive adhesive and more preferably uncured and pressure-sensitive adhesive. Here, "energy rays" and "being energy ray-curable" are as described above.

The energy ray-curable resin layer may be a single layer (monolayer) or a plurality of layers of two or more layers, and, in a case in which the energy ray-curable resin layer is a plurality of layers, the respective layers in the plurality of layers may be identical to or different from one another, and the combination of the plurality of layers is not particularly limited.

The thickness of the energy ray-curable resin layer is preferably 1 to 100 μm, more preferably 5 to 90 μm, and particularly preferably 5 to 80 μm. When the thickness of the energy ray-curable resin layer is equal to or more than the lower limit value, it is possible to form a first protective film having a higher protection function. In addition, when the thickness of the energy ray-curable resin layer is equal to or less than the upper limit value, excessive thickness is suppressed.

Here, "the thickness of the energy ray-curable resin layer" refers to the thickness of the entire energy ray-curable resin layers, and, for example, the thickness of the energy ray-curable resin layer made up of a plurality of layers refers to the total thickness of all of the layers constituting the energy ray-curable resin layer.

The curing conditions when the energy ray-curable resin layer is attached to the bump-formed surface of the semiconductor wafer and is cured so as to form the first protective film are not particularly limited as long as the first protective film has a sufficient hardness so as to exert its function, and may be appropriately selected according to the kinds of the thermosetting resin layers.

For example, the illuminance of the energy ray during the curing of the energy ray-curable resin layer is preferably 10 to 1,000 mW/cm$^2$, more preferably 50 to 500 mW/cm$^2$, and particularly preferably 100 to 300 mW/cm$^2$. In addition, the light intensity of the energy ray during the curing is preferably 50 to 2,000 mJ/cm$^2$, more preferably 100 to 1,500 mJ/cm$^2$, and particularly preferably 150 to 1,000 mJ/cm$^2$.

<<Energy Ray-Curable Resin Layer Forming Composition>>

The energy ray-curable resin layer can be formed using an energy ray-curable resin layer forming composition containing a constituent material thereof. For example, the energy ray-curable resin layer can be formed at an intended portion by applying an energy ray-curable resin layer forming composition to a target surface on which the energy ray-curable resin layer is to be formed and drying the energy ray-curable resin layer forming composition as necessary. The ratio between the amounts of components, which do not gasify at normal temperature, in the energy ray-curable resin layer forming composition is, generally, identical to the ratio between the amounts of the above-described components in the energy ray-curable resin layer. Here, "normal temperature" is as described above.

The energy ray-curable resin layer forming composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the energy ray-curable resin layer forming composition are not particularly limited; however, in a case in which the energy ray-curable resin layer forming composition contains a solvent described below, the energy ray-curable resin layer forming composition is preferably heated and dried. The energy ray-curable resin layer forming composition containing a solvent is preferably dried at 70° C. to 130° C. for 10 seconds to 5 minutes.

<Resin Layer Forming Composition (IV-1)>

Examples of the energy ray-curable resin layer forming composition include an energy ray-curable resin layer forming composition (IV-1) containing the energy ray-curable component (a) (in the present specification, in some cases, abbreviated as "the resin layer forming composition (IV-1)") and the like.

[Energy Ray-Curable Component (a)]

The energy ray-curable component (a) is a component that is cured by being irradiated with energy rays and is a component for imparting a film-forming property, flexibility, and the like to the energy ray-curable resin layer.

Examples of the energy ray-curable component (a) include a polymer (a1) which has an energy ray-curable group and a weight-average molecular weight of 80,000 to 2,000,000 and a compound (a2) which has an energy ray-curable group and a molecular weight of 100 to 80,000.

The polymer (a1) may be a polymer at least a part of which is crosslinked with a crosslinking agent or a polymer which is not crosslinked.

(Polymer Having Energy Ray-Curable Group and Weight-Average Molecular Weight of 80,000 to 2,000,000 (a1))

Examples of the polymer (a1) which has an energy ray-curable group and a weight-average molecular weight of 80,000 to 2,000,000 include an acrylic resin (a1-1) formed by performing addition reaction on an acrylic polymer (a11) having a functional group capable of reacting with groups in other compounds and an energy ray-curable compound (a12) having a group that reacts with the functional group and an energy ray-curable group such as an energy ray-curable double bond.

Examples of the functional group capable of reacting with groups in other compounds include a hydroxyl group, a carboxy group, an amino group, a substituted amino group (a group formed by substituting one or two hydrogen atoms in an amino group with a group other than a hydrogen atom), an epoxy group, and the like. Here, the functional group is preferably a group other than a carboxy group from the viewpoint of preventing the corrosion of circuits of semiconductor wafers, semiconductor chips, or the like.

Among these, the functional group is preferably a hydroxyl group.

Acrylic Polymer Having Functional Group (a11)

Examples of the acrylic polymer (a11) having a functional group include acrylic polymers formed by copolymerizing an acrylic monomer having the above-described functional group and an acrylic monomer not having the above-described functional group, and the acrylic polymer may be an acrylic polymer formed by copolymerizing the above-described monomers and, furthermore, a monomer other than acrylic monomers (non-acrylic monomer).

In addition, the acrylic polymer (a11) may be a random copolymer or a block copolymer.

Examples of the acrylic monomer having a functional group include hydroxyl group-containing monomers, carboxy group-containing monomers, amino group-containing monomers, substituted amino group-containing monomers, epoxy group-containing monomers, and the like.

Examples of the hydroxyl group-containing monomers include hydroxyalkyl (meth)acrylates such as hydroxymethyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; non-(meth)acrylic unsaturated alcohols such as vinyl alcohol and allyl alcohol (unsaturated alcohols not having a (meth)acryloyl skeleton); and the like.

Examples of the carboxy group-containing monomers include ethylenic unsaturated monocarboxylic acids such as (meth)acrylic acid and crotonic acid (monocarboxylic acids having an ethylenic unsaturated bond); ethylenic unsaturated dicarboxylic acids such as fumaric acid, itaconic acid, maleic acid, and citraconic acid (dicarboxylic acids having an ethylenic unsaturated bond); anhydrides of the ethylenic unsaturated dicarboxylic acid; carboxyalkyl (meth)acrylates such as 2-carboxyethyl methacrylate; and the like.

The acrylic monomer having a functional group is preferably the hydroxyl group-containing monomer or the carboxy group-containing monomer and more preferably the hydroxyl group-containing monomer.

The acrylic polymer (a11) may be constituted of only one type or two or more types of the acrylic monomers having a functional group, and, in a case in which the acrylic polymer is constituted of two or more types of the acrylic monomers having a functional group, the combination and ratio thereof can be arbitrarily selected.

Examples of the acrylic monomer not having a functional group include alkyl (meth)acrylates in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, and octadecyl (meth)acrylate (stearyl (meth)acrylate) and the like In addition, examples of the acrylic monomer not having a functional group also include alkoxyalkyl group-containing (meth)acrylic acid esters such as methoxymethyl (meth)acrylate, methoxyethyl (meth)acrylate, ethoxymethyl (meth)acrylate, and ethoxyethyl (meth)acrylate; (meth)acrylic acid esters having an aromatic group which includes (meth)acrylic acid aryl ester such as phenyl (meth)acrylate or the like; non-crosslinkable (meth)acrylamides and derivatives thereof; (meth)acrylic acid esters having a non-crosslinkable tertiary amino group such as N,N-dimethyl aminoethyl (meth)acrylate and N,N-dimethyl aminopropyl (meth)acrylate; and the like.

The acrylic polymer (a11) may be constituted of only one type or two or more types of the acrylic monomers not having a functional group, and, in a case in which the acrylic polymer is constituted of two or more types of the acrylic monomers not having a functional group, the combination and ratio thereof can be arbitrarily selected.

Examples of the non-acrylic monomer include olefins such as ethylene and norbornene; vinyl acetate; styrene; and the like.

The acrylic polymer (a11) may be constituted of only one type or two or more types of the non-acrylic monomers, and, in a case in which the acrylic polymer is constituted of two or more types of the non-acrylic monomers, the combination and ratio thereof can be arbitrarily selected.

The ratio (amount) of a constituent unit derived from the acrylic monomer having a functional group with respect to the total amount of constituent units constituting the acrylic polymer (a11) is preferably 0.1% to 50% by mass, more preferably 1% to 40% by mass, and particularly preferably 3% to 30% by mass. When the ratio is in the above-described range, in the acrylic resin (a1-1) obtained by polymerization between the acrylic polymer (a11) and the energy ray-curable compound (a12), it becomes possible to easily adjust the degree of curing of the first protective film to a preferred range by satisfying the amount of the energy ray-curable group.

The acrylic polymer (a11) may be constituted of only one type or two or more types of the acrylic resins (a1-1), and, in a case in which the acrylic polymer is constituted of two or more types of the acrylic resins, the combination and ratio thereof can be arbitrarily selected.

In the resin layer forming composition (IV-1), the amount of the acrylic resin (a1-1) is preferably 1 to 40, more preferably 2 to 30, and particularly preferably 3 to 20.

Energy Ray-Curable Compound (a12)

The energy ray-curable compound (a12) is preferably an energy ray-curable compound having one or more types of groups selected from the group consisting of an isocyanate group, an epoxy group, and a carboxy group as the group capable of reacting with the functional group in the acrylic polymer (a11) and more preferably an energy ray-curable compound having an isocyanate group as the above-described group. For example, in a case in which the energy ray-curable compound (a12) has an isocyanate group as the above-described group, this isocyanate group easily reacts with a hydroxyl group in the acrylic polymer (a11) having a hydroxyl group as the functional group.

The number of the energy ray-curable groups in one molecule of the energy ray-curable compound (a12) is preferably 1 to 5 and more preferably 1 or 2.

Examples of the energy ray-curable compound (a12) include 2-methacryloyloxyethyl isocyanate, methaisopropenyl-α,α-dimethylbenzyl isocyanate, methacryloyl isocyanate, allyl isocyanate, 1,1-(bisacryloyloxymethyl)ethyl isocyanate;

acryloyl monoisocyanate compounds obtained by a reaction between a diisocyante compound or a polyisocyanate compound and hydroxyethyl (meth)acrylate; and acryloyl monoisocyanate compounds obtained from a reaction among a diisocyante compound or a polyisocyanate compound, a polyol compound, and hydroxyethyl (meth) acrylate; and the like.

Among these, the energy ray-curable compound (a12) is preferably 2-methacryloyloxyethyl isocyanate.

The energy ray-curable compound (a12) may be constituted of only one type or two or more types of the acrylic resins (a1-1), and, in a case in which the energy ray-curable compound is constituted of two or more types of the acrylic resins, the combination and ratio thereof can be arbitrarily selected.

The ratio of the amount of an energy ray-curable group derived from the energy ray-curable compound (a12) with respect to the amount of the functional group derived from the acrylic polymer (a11) in the acrylic resin (a1-1) is preferably 20 to 120 mol %, more preferably 35 to 100 mol %, and particularly preferably 50 to 100 mol %. When the ratio of the amount thereof is in the above-described range, the adhesive force of the first protective film after curing becomes stronger. Meanwhile, in a case in which the energy ray-curable compound (a12) is a monofunctional compound (having one group in one molecule), the upper limit value of the ratio of the amount thereof becomes 100 mol %; however, in a case in which the energy ray-curable compound (a12) is a polyfunctional compound (having two or more groups in one molecule), the upper limit value of the ratio of the amount thereof exceeds 100 mol % in some cases.

The weight-average molecular weight (Mw) of the polymer (a1) is preferably 100,000 to 2,000,000 and more preferably 300,000 to 1,500,000.

Here, "the weight-average molecular weight" is as described above.

In a case in which at least a part of the polymer (a1) is crosslinked with a crosslinking agent, the polymer (a1) may be a polymer that is formed by polymerizing monomers which do not correspond to any of the monomers described above as the monomers constituting the acrylic polymer (a11) and have a group that reacts with the crosslinking agent and is crosslinked in the group that reacts with the crosslinking agent or may be a polymer crosslinked in a group which is derived from the energy ray-curable compound (a12) and reacts with the functional group.

The resin layer forming composition (IV-1) and the energy ray-curable resin layer may contain only one type or two or more types of the polymers (a1), and, in a case in which the resin layer forming composition and the energy ray-curable resin layer contain two or more types of the polymers, the combination and ratio thereof can be arbitrarily selected.

(Compound Having Energy Ray-Curable Group and Molecular Weight of 100 to 80,000 (a2))

Examples of the energy ray-curable group in the compound (a2) which has an energy ray-curable group and a molecular weight of 100 to 80,000 include groups having an energy ray-curable double bond, and preferred examples thereof include a (meth)acryloyl group, a vinyl group, and the like.

The compound (a2) is not particularly limited as long as the compound satisfies the above-described conditions, and examples thereof include low-molecular-weight compounds having an energy ray-curable group, epoxy resins having an energy ray-curable group, phenolic resins having an energy ray-curable group, and the like.

Among the compound (a2), examples of the low-molecular-weight compounds having an energy ray-curable group include polyfunctional monomers, oligomers, and the like, and acrylate-based compounds having a (meth)acryloyl group are preferred.

Examples of the acrylate-based compounds include difunctional (meth)acrylates such as 2-hydroxy-3-(meth) acryloyloxypropoyl methacrylate, polyethylene glycol di(meth)acrylate, propoxylated ethoxylated bisphenol A di(meth)acrylate, 2,2-bis[4-((meth)acryloxypolyethoxy) phenyl]propane, ethoxylated bisphenol A di(meth)acrylate, 2,2-bis[4-((meth)acryloxydiethoxy)phenyl]propane, 9,9-bis [4-(2-(meth)acryloyloxyethoxy)phenyl]fluorene, 2,2-bis[4-((meth)acryloxypolypropoxy)phenyl]propane, tricyclodecanedimethanol di(meth)acrylate, 1,10-decanediol di(meth) acrylate, 1,6-hexanediol di(meth)acrylate, 1,9-nonanediol di(meth)acrylate, dipropylene glycol di(meth)acrylate, tripropylene glycol di(meth)acrylate, polypropylene glycol di(meth)acrylate, polytetramethylene glycol di(meth)acrylate, ethylene glycol di(meth)acrylate, diethylene glycol di(meth)acrylate, triethylene glycol di(meth)acrylate, 2,2-bis[4-((meth)acryloylethoxy)phenyl]propane, neopentyl glycol di(meth)acrylate, ethoxylated polypropylene glycol di(meth)acrylate, and 2-hydroxy-1,3-di(meth)acryloxypropane;

polyfunctional (meth)acrylates such as tris(2-(meth)acryloxyethyl) isocyanurate, ε-caprolactone-modified tris-(2-(meth)acryloxyethyl) isocyanurate, ethoxylated glycerin tri (meth)acrylate, pentaerythritol tri(meth)acrylate, trimethylolpropane tri(meth)acrylate, ditrimethylolpropane tetra(meth)acrylate, ethoxylated pentaerythritol tetra(meth) acrylate, pentaerythritol tetra(meth)acrylate, dipentaerythritol poly(meth)acrylate, and dipentaerythritol hexa(meth) acrylate;

polyfunctional (meth)acrylate oligomers such as urethane (meth)acrylate oligomers; and the like.

Among the compound (a2), as the epoxy resins having an energy ray-curable group and the phenolic resins having an energy ray-curable group, for example, the epoxy resins and the phenolic resins described in Paragraph 0043 and the like of "Japanese Unexamined Patent Application, First Publication No. 2013-194102" can be used. These resins also correspond to resins constituting a thermosetting component described below; however, in the present invention, the resins will be handled as the compound (a2).

The weight-average molecular weight of the compound (a2) is preferably 100 to 30,000 and more preferably 300 to 10,000.

The resin layer forming composition (IV-1) and the energy ray-curable resin layer may contain only one type or two or more types of the compounds (a2), and, in a case in which the resin layer forming composition and the energy ray-curable resin layer contain two or more types of the polymers, the combination and ratio thereof can be arbitrarily selected.

[Polymer not Having Energy Ray-Curable Group (b)]

In the case of containing the compound (a2) as the energy ray-curable component (a), the resin layer forming composition (IV-1) and the energy ray-curable resin layer preferably further contain a polymer (b) not having any energy ray-curable groups.

The polymer (b) may be a polymer at least a part of which is crosslinked with a crosslinking agent or a polymer which is not crosslinked.

Examples of the polymer (b) not having any energy ray-curable group include acrylic polymers, phenoxy resins, urethane resins, polyesters, rubber-based resins, acrylic urethane resins, and the like.

Among these, the polymer (b) is preferably an acrylic polymer (hereinafter, in some cases, abbreviated as "the acrylic polymer (b-1)").

The acrylic polymer (b-1) may be a well-known acrylic polymer, and, for example, the acrylic polymer may be a homopolymer of one type of acrylic monomer, a copolymer of two or more types of acrylic monomers, or a copolymer of one or more types of acrylic monomers and one or more types of monomers other than acrylic monomers (non-acrylic monomers).

Examples of the acrylic monomer constituting the acrylic polymer (b-1) include alkyl (meth)acrylates, (meth)acrylic acid ester having a cyclic skeleton, glycidyl group-containing (meth)acrylic acid ester, hydroxyl group-containing (meth)acrylic acid esters, and substituted amino group-containing (meth)acrylic acid esters. Here, "substituted amino group" is as described above.

Examples of the alkyl (meth)acrylic acid esters include alkyl (meth)acrylic acid esters in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth) acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth) acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth) acrylate), pentadecyl (meth)acrylate, hexadecyl (meth)acrylate (palmityl (meth)acrylate), heptadecyl (meth)acrylate, and octadecyl (meth)acrylate (stearyl (meth)acrylate) and the like.

Examples of the (meth)acrylic acid esters having a cyclic skeleton include cycloalkyl (meth)acrylic acid esters such as isobornyl (meth)acrylate and dicyclopentanyl (meth)acrylate;

aralkyl (meth)acrylic acid esters such as benzyl (meth) acrylate;

cycloalkenyl (meth)acrylic acid esters such as dicyclopentenyl (meth)acrylate;

cycloalkenyloxy alkyl (meth)acrylic acid esters such as dicyclopentenyloxyethyl (meth)acrylate; and the like.

Examples of the glycidyl group-containing (meth)acrylic acid esters include glycidyl (meth)acrylate and the like.

Examples of the hydroxyl group-containing (meth)acrylic acid esters include hydroxymethyl (meth)acrylate, 2-hydroxyethyl (meth)acrylate, 2-hydroxypropyl (meth)acrylate, 3-hydroxypropyl (meth)acrylate, 2-hydorybutyl (meth)acrylate, 3-hydroxybutyl (meth)acrylate, 4-hydroxybutyl (meth) acrylate, and the like.

Examples of the substituted amino group-containing (meth)acrylic acid esters include N-methylaminoethyl (meth)acrylate and the like.

Examples of the non-acrylic monomer constituting the acrylic polymer (b-1) include olefins such as ethylene and norbornene; vinyl acetate; styrene; and the like.

Examples of the polymer (b) at least a part of which is crosslinked with a crosslinking agent and which does not have the energy ray-curable group include polymers in which a reactive functional group in the polymer (b) reacts with a crosslinking agent.

The reactive functional group may be appropriately selected depending on the type and the like of the crosslinking agent and is not particularly limited. For example, in a case in which the crosslinking agent is a polyisocyanate compound, examples of the reactive functional group include a hydroxyl group, a carboxy group, an amino group, and the like, and, among these, the hydroxyl group that is highly reactive with isocyanate groups is preferred. In addition, in a case in which the crosslinking agent is an epoxy-based compound, examples of the reactive functional group include a carboxy group, an amino group, an amide group, and the like, and, among these, the carboxy group that is highly reactive with epoxy groups is preferred. Here, the reactive functional group is preferably a group other than a carboxy group from the viewpoint of preventing the corrosion of circuits of semiconductor wafers or semiconductor chips.

Examples of the polymer (b) which has the reactive functional group but does not have any energy ray-curable groups include polymers obtained by polymerizing monomers having at least the reactive functional group. In the case of the acrylic polymer (b-1), as any one or both of the acrylic monomer and the non-acrylic monomer that have been exemplified as the monomers constituting the acrylic polymer, monomers having a reactive functional group may be used. Examples of the polymer (b) having a hydroxyl group as the reactive functional group include polymers obtained by polymerizing hydroxyl group-containing (meth) acrylic acid ester and also include polymers obtained by polymerizing monomers formed by substituting one or more hydrogen atoms in the previously exemplified acrylic monomer or non-acrylic monomer with the reactive functional group.

In the polymer (b) having a reactive functional group, the ratio (amount) of the amount of a constituent unit derived from a monomer having a reactive functional group is preferably 1 to 20% by mass and more preferably 2 to 10% by mass with respect to the total amount of constituent units constituting the polymer. When the ratio is in the above-described range, in the polymer (b), the degree of crosslinking is in a more preferred range.

The weight-average molecular weight (Mw) of the polymer (b) not having any energy ray-curable groups is preferably 10,000 to 2,000,000 and more preferably 100,000 to 1,500,000 since the film-forming property of the resin layer forming composition (IV-1) becomes more preferable.

Here, "the weight-average molecular weight" is as described above.

The resin layer forming composition (IV-1) and the energy ray-curable resin layer may contain only one type or two or more types of the polymers (b) not having any energy ray-curable groups, and, in a case in which the resin layer forming composition and the energy ray-curable resin layer contain two or more types of the polymers not having any energy ray-curable groups, the combination and ratio thereof can be arbitrarily selected.

Examples of the resin layer forming composition (IV-1) include compositions containing any one or both of the polymer (a1) and the compound (a2).

In the case of containing the compound (a2), the resin layer forming composition (IV-1) preferably further contains a polymer (b) not having an energy ray-curable group, and in this case, the polymer (a1) is further preferably contained. In addition, the resin layer forming composition (IV-1) may contain the polymer (a1) and the polymer (b) not having any energy ray-curable groups without containing the compound (a2).

In a case where the resin layer forming composition (IV-1) contains the polymer (a1), the compound (a2), and the polymer (b) not having any energy ray-curable groups, in the resin layer forming composition (IV-1), the amount of the compound (a2) is preferably 10 to 400 parts by mass, and more preferably 30 to 350 parts by mass with respect to the total amount (100 parts by mass) of the polymer (a1) and the polymer (b) not having any energy ray-curable groups.

In the resin layer forming composition (IV-1), the ratio of the total amount of the energy ray-curable component (a) and the polymer (b) not having any energy ray-curable groups (that is, the total amount of the energy ray-curable component (a) and the polymer (b) not having any energy ray-curable groups in the energy ray-curable resin layer) with respect to the total amount of the components other than the solvent is preferably 5% to 90% by mass, more preferably 10% to 80% by mass, and particularly preferably 20% to 70% by mass. When the ratio of the amount of the energy ray-curable component is in the above-described range, the energy ray-curing property of the energy ray-curable resin layer becomes more favorable.

The resin layer forming composition (IV-1) may also contain, in addition to the energy ray-curable component, one or more types of elements selected from the group consisting of a thermosetting component, a photopolymerization initiator, a filler, a coupling agent, a crosslinking agent, and a versatile additive depending on the purpose. For example, when the resin layer forming composition (IV-1) containing the energy ray-curable component and a thermosetting component is used, the adhesive force of an energy ray-curable resin layer to be formed to adherends improves by heating, and the strength of the first protective film formed of this energy ray-curable resin layer also improves.

As the thermosetting component, the photopolymerization initiator, the filler, the coupling agent, the crosslinking agent, and the versatile additive in the resin layer forming composition (IV-1), it is possible to exemplify those which are the same as the thermosetting component (B), the photopolymerization initiator (H), the filler (D), the coupling agent (E), the crosslinking agent (F), and the versatile additive (I) in the resin layer forming composition (III-1).

In the resin layer forming composition (IV-1), one type of each of the thermosetting component, the photopolymerization initiator, the filler, the coupling agent, the crosslinking agent, and the versatile additive may be used singly or two or more types thereof may be jointly used, and, in a case in which two or more types thereof are used, the combination and ratio thereof can be arbitrarily selected.

The amounts of the thermosetting component, the photopolymerization initiator, the filler, the coupling agent, the crosslinking agent, and the versatile additive in the resin layer forming composition (IV-1) may be appropriately adjusted depending on the purpose and are not particularly limited.

From the view point that the handling property of the resin layer forming composition (IV-1) improves by dilution, it is preferable that the resin layer forming composition (IV-1) further contains a solvent.

Examples of the solvent contained in the resin layer forming composition (IV-1) include the same solvent as that in the resin layer forming composition (III-1).

The resin layer forming composition (IV-1) may contain only one type or two or more types of the solvents.

<<Method for Manufacturing of Energy Ray-Curable Resin Layer Forming Composition>>

The energy ray-curable resin layer forming composition such as the resin layer forming composition (IV-1) can be obtained by blending individual components for constituting the energy ray-curable resin layer forming composition.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

Method for Manufacturing First Protective Film Forming Sheet

The first protective film forming sheet can be manufactured by sequentially stacking the respective layers described above so as to obtain the corresponding positional relationship. The methods for forming the respective layers are as described above.

For example, in the manufacturing of the first supporting sheet, in a case in which the first pressure-sensitive adhesive layer or the first interlayer is stacked on the first base material, the first pressure-sensitive adhesive layer or the first interlayer can be stacked by applying the first pressure-sensitive adhesive composition or the first interlayer forming composition described above onto the first base material and drying the composition or irradiating the composition with energy rays as necessary.

Meanwhile, for example, in a case in which the curable resin layer is further stacked on the first pressure-sensitive adhesive layer that has been stacked on the first base material, the curable resin layer can be directly formed by applying the thermosetting resin layer forming composition or the energy ray-curable resin layer forming composition on the first pressure-sensitive adhesive layer. Similarly, in a case in which the first pressure-sensitive adhesive layer is further stacked on the first interlayer that has been stacked on the first base material, the first pressure-sensitive adhesive layer can be directly formed by applying the first pressure-sensitive adhesive composition onto the first interlayer. As described above, in a case in which a stacking structure of two continuous layers is formed using any compositions, it is possible to newly form a layer by further applying the composition onto a layer formed of the above-described composition. Here, the stacking structure of two continuous layers is preferably formed by forming, between these two layers, the layer which is stacked later on a separate peeling film in advance using the above-described composition and attaching the exposed surface of the already-formed layer opposite to the surface in contact with the peeling film to the exposed surface of the other layer that has been formed. At this time, the above-described composition is preferably applied onto a peeling-treated surface of the peeling film. The peeling film may be removed as necessary after the formation of the stacking structure.

For example, in a case in which a first protective film forming sheet formed by stacking the first pressure-sensitive adhesive layer on the first base material and stacking the curable resin layer on the first pressure-sensitive adhesive layer (the first protective film forming sheet in which the first supporting sheet is a stack of the first base material and the first pressure-sensitive adhesive layer) is manufactured, the first protective film forming sheet can be obtained by applying the first pressure-sensitive adhesive composition onto the first base material and drying the first pressure-sensitive adhesive composition as necessary so as to stack the first pressure-sensitive adhesive layer on the first base material, separately, applying the thermosetting resin layer forming composition or the energy ray-curable resin layer forming composition onto the peeling film and drying the curable resin layer forming composition as necessary so as to form the curable resin layer on the peeling film, and attaching the exposed surface of the curable resin layer to the exposed surface of the first pressure-sensitive adhesive layer that has been stacked on the first base material so as to stack the curable resin layer on the first pressure-sensitive adhesive layer.

In addition, for example, in a case in which a first supporting sheet formed by stacking the first interlayer on the first base material and stacking the first pressure-sensitive adhesive layer on the first interlayer is manufactured, the first supporting sheet can be obtained by applying the first interlayer forming composition onto the first base material and drying the first interlayer forming composition or irradiating the first interlayer forming composition with energy rays as necessary so as to stack the first interlayer on the first base material, separately, applying the first pressure-sensitive adhesive composition onto the peeling film and drying the first pressure-sensitive adhesive composition as necessary so as to form the first pressure-sensitive adhesive layer on the peeling film, and attaching the exposed surface of the first pressure-sensitive adhesive layer to the exposed surface of the first interlayer that has been stacked on the first base material so as to stack the first pressure-sensitive adhesive layer on the first interlayer. In this case, the first protective film forming sheet can be obtained by, for example, separately, further applying the thermosetting resin layer forming composition or the energy ray-curable resin layer forming composition onto the peeling film and drying the curable resin layer forming composition as necessary so as to form the curable resin layer on the peeling film and attaching the exposed surface of the curable resin layer to the exposed surface of the first pressure-sensitive adhesive layer that has been stacked on the first interlayer so as to stack the curable resin layer on the first pressure-sensitive adhesive layer.

Meanwhile, in a case in which the first pressure-sensitive adhesive layer or the first interlayer is stacked on the first base material, as described above, the first pressure-sensitive adhesive layer or the first interlayer may be stacked on the first base material by, instead of applying the first pressure-sensitive adhesive composition or the first interlayer forming composition onto the first base material, applying the first pressure-sensitive adhesive composition or the first interlayer forming composition onto the peeling film and drying the composition or irradiating the composition with energy rays as necessary so as to form the first pressure-sensitive adhesive layer or the first interlayer on the peeling film and attaching the exposed surface of this layer to one surface of the first base material so as to stack the first pressure-sensitive adhesive layer or the first interlayer on the first base material.

In any of the methods, the peeling film may be removed at an arbitrary timing after the formation of the intended stacking structure.

As described above, all of the layers other than the first base material which constitute the first protective film forming sheet can be stacked using a method in which the layers are formed on the peeling film in advance and attached on a surface of an intended layer, and thus the first protective film forming sheet may be manufactured by appropriately selecting layers for which the above-described steps are employed as necessary.

Meanwhile, the first protective film forming sheet is, generally, stored in a state in which the peeling film is attached to the surface of the outermost layer on the opposite side to the first supporting sheet (for example, the curable resin layer). Therefore, the first protective film forming sheet can also be obtained by applying a composition for forming a layer constituting the outermost layer such as thermosetting resin layer forming composition or the energy ray-curable resin layer forming composition onto the peeling film (preferably the peeling-treated surface thereof) and drying the applied peeling film as necessary so as to form the layer constituting the outermost layer on the peeling film, stacking the remaining layers on the exposed surface on the opposite side to the surface of the layer in contact with the peeling film using any of the above-described methods, and leaving the layers in the attached state without removing the peeling film.

EXAMPLES

Hereinafter, the present invention will be more specifically described using specific examples. However, the present invention is not limited to examples described below.

The components used for manufacturing the thermosetting resin layer forming composition are indicated below.

Polymer Component

Polymer component (A)-1: An acrylic resin (having a weight-average molecular weight of 800,000 and a glass transition temperature of −28° C.) obtained by copolymerizing butyl acrylate (hereinafter, abbreviated as "BA") (55 parts by mass), methyl acrylate (hereinafter, abbreviated as "MA") (10 parts by mass), glycidyl methacrylate (hereinafter, abbreviated as "GMA") (20 parts by mass), and 2-hydroxyethyl acrylate (hereinafter, abbreviated as "HEA") (15 parts by mass).

Polymer component (A)-2: An acrylic resin (having a weight-average molecular weight of 400,000 and a glass transition temperature of −1° C.) obtained by copolymerizing BA (10 parts by mass), MA (70 parts by mass), GMA (5 parts by mass), and HEA (15 parts by mass).

Epoxy Resin

Epoxy resin (B1)-1: A liquid bisphenol F type epoxy resin ("YL 983 U" manufactured by Mitsubishi Chemical Corporation)

Epoxy resin (B1)-2: A polyfunctional aromatic type epoxy resin ("EPPN-502H" manufactured by Nippon Kayaku Co., Ltd.)

Epoxy resin (B1)-3: A dicyclopentadiene type epoxy resin ("EPICLON HP-7200" manufactured by DIC Corporation)

Epoxy resin (B1)-4: A mixture of a liquid bisphenol A type epoxy resin and acrylic rubber fine particles ("BPA 328" manufactured by Nippon Shokubai Co., weight average molecular weight of epoxy resin: 400, degree of dispersion of epoxy resin: 1.4)

Thermal Curing Agent

Thermal curing agent (B2)-1: A novolac-type phenolic resin ("BRG-556" manufactured by Showa Denko KK)

Curing Accelerator

Curing accelerator (C)-1: 2-phenyl-4,5-dihydroxymethylimidazole ("Curezol 2 PHZ-PW" manufactured by Shikoku Chemicals Corporation)

Filler

Filler (D)-1: A spherical silica modified with an epoxy group ("Admanano YA 050 C-MKK" manufactured by Admatechs.)

Manufacturing Example 1

(Manufacturing of Pressure-Sensitive Adhesive Resin (I-2a))

A polymerization reaction was performed so as to obtain an acrylic polymer by using 2-ethylhexyl acrylate (hereinafter, abbreviated as "2EHA") (80 parts by mass) and HEA (20 parts by mass) as raw materials of a copolymer.

2-methacryloyloxyethyl isocyanate (hereinafter, abbreviated as "MOI") (22 parts by mass, approximately 80 mol % with respect to HEA) was added to the acrylic polymer, and an addition reaction was performed at 50° C. for 48 hours in an air stream so as to obtain a target pressure-sensitive adhesive resin (I-2a).

Example 1

<Manufacturing of First Protective Film Forming Sheet>
(Manufacturing of Thermosetting Resin Layer Forming Composition)

The polymer component (A)-1, the epoxy resin (B1)-1, the epoxy resin (B1)-2, the epoxy resin (B1)-3, the thermal curing agent (B2)-1, the curing accelerator (C)-1, and the filler (D)-1 were dissolved or dispersed in methyl ethyl ketone such that the ratios of these amounts are the values indicated in the following Table 1, and stirred at 23° C. so as to obtain a resin layer forming composition (III-1) having the solid content concentration of 55% by mass as a thermosetting resin layer forming composition.

Note that, the description "−" in the column of contained components in the following Table 1 means that the thermosetting resin layer forming composition does not contain that component.

(Manufacturing of First Pressure-Sensitive Adhesive Composition)

As an isocyanate crosslinking agent, a tolylene diisocyanate trimer adduct of trimethylolpropane ("Coronate L" manufactured by Tosoh Corporation) (0.5 parts by mass) was added to the pressure-sensitive adhesive resin (I-2a) (100 parts by mass) obtained in Manufacturing Example 1 and stirred at 23° C. so as to obtain a first pressure-sensitive adhesive composition (I-2) having the solid content concentration of 30% by mass, as the first pressure-sensitive adhesive composition.

Note that, the number of compounding parts in this "Manufacturing of First Pressure-Sensitive Adhesive Composition" is all in terms of solid content.

(Manufacturing of First Protective Film Forming Sheet)

The above-obtained first pressure-sensitive adhesive composition was applied onto a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was heated and dried at 120° C. for two minutes, thereby forming a first pressure-sensitive adhesive layer with a thickness of 30 μm. Two pressure-sensitive adhesive sheets in which the first pressure-sensitive adhesive layer with a thickness of 30 μm was stacked on the peeling film as described above were produced.

Next, as for one pressure-sensitive adhesive sheet, a stacked film with a thickness of 105 μm formed by stacking a polyolefin film (thickness: 25 μm), an adhesive layer (thickness: 2.5 μm), a polyethylene terephthalate film (thickness: 50 μm), an adhesive layer (thickness: 2.5 μm), and a polyolefin film (thickness: 25 μm) in this order was attached as a first base material to an exposed surface of the first pressure-sensitive adhesive layer, thereby obtaining a stacked body in which the peeling film, the first pressure-sensitive adhesive layer, and the stacked film were stacked in this order.

Furthermore, the peeling film was removed from this stacked body, and the first pressure-sensitive adhesive layer of the other pressure-sensitive adhesive sheet obtained as described above was attached to the exposed first pressure-sensitive adhesive layer, thereby obtaining a first supporting sheet in which a first pressure-sensitive adhesive layer with a thickness of 60 μm having a bilayer structure was provided on the first base material with a thickness of 105 μm.

The above-obtained thermosetting resin layer forming composition was applied onto a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was dried at 100° C. for two minutes, thereby forming a thermosetting resin film (thermosetting resin layer) with a thickness of 40 μm. Two resin sheets in which the thermosetting resin film with a thickness of 40 μm was stacked on the peeling film as described above were produced.

Next, regarding one of the resin sheet, by attaching the first pressure-sensitive adhesive layer of the obtained first supporting sheet to the exposed surface of the thermosetting resin film, the stacked body in which the obtained first supporting sheet, the thermosetting resin film, and the peeling film were stacked in this order can be obtained.

Furthermore, the peeling film was removed from this stacked body, and the thermosetting resin film of the other resin sheet obtained as described above was attached to the exposed thermosetting resin film, thereby obtaining a first protective film forming sheet formed by stacking the first base material (thickness: 105 μm), the first pressure-sensitive adhesive layer (thickness: 60 μm), the thermosetting resin film (that is, the thermosetting resin layer, the thickness: 80 μm), and the peeling film in this order in the thickness direction thereof.

<Evaluation of Cured Material of Thermosetting Resin Film>

(Measuring of Young's Modulus)

The thermosetting resin layer forming composition obtained as described above was applied onto a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was dried at 100° C. for two minutes, thereby forming a thermosetting resin film (thermosetting resin layer) with a thickness of 25 μm. Eight sheets of the thermosetting resin film stacked on the peeling film were prepared, and an operation of attaching these thermosetting resin films to each other using a roller at 70° C. after removing the peeling film as necessary was repeatedly performed, so as to finally manufacture a thermosetting resin film having an 8-layer structure with a thickness of 200 μm.

Then, the obtained thermosetting resin film having an 8-layer structure was cut out so as to have a width of 15 mm and a length of 80 mm, and the cut thermosetting resin film was placed on an iron plate of which the surface was peeling-treated and was heated in an oven at 130° C. for two hours so as to thermally cure the thermosetting resin film, thereby preparing a test piece of a cured material. This test piece can be used as a first protective film at the time of dicing from the viewpoint of curing degree.

Next, by using a universal testing machine ("5581 type" manufactured by Instron, a division of Illinois Tool Works Inc.), the test piece having a temperature of 80° C. was pulled at a speed of 200 mm/min based on JIS K 7127, and the Young's modulus (initial modulus) was calculated. The results are indicated in Table 1.

(Measuring of Tack Peak Load)

The thermosetting resin layer forming composition obtained as described above was applied onto a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was dried at 100° C. for two minutes, thereby forming a thermosetting resin film (thermosetting resin layer) with a thickness of 40 μm. Two resin sheets in which the thermosetting resin film with a thickness of 40 μm was stacked on the peeling film as described above were produced.

Next, a thermosetting resin film (thermosetting resin layer) with a thickness of 80 μm having a two-layer structure provided with the peeling film on both surfaces by attaching the exposed surface of the thermosetting resin film of the other resin sheet to the exposed surface of the thermosetting resin film of one resin sheet was manufactured.

Then, the obtained thermosetting resin film with a thickness of 80 μm was placed on an iron plate of which the surface was peeling-treated, and was heated in an oven at 130° C. for two hours so as to thermally cure the thermosetting resin film, thereby preparing a test piece of a cured material. This test piece can be used as a first protective film at the time of dicing from the viewpoint of curing degree.

Next, a probe was brought into contact with this test piece by using Probe Tack Tester ("RPT 100" manufactured by RHESCA CO., LTD.) so as to measure a peak load (the tack peak load). More spec procedures are as follows. That is, the surface opposite to the measurement surface of the test piece faced upward, and a metal plate whose temperature is 80° C. was placed on the surface. Further, a load was applied to the test piece by pressing a stainless steel probe (diameter of 5 mm) whose temperature is 80° C. against the measurement surface of the test piece from below. At this time, the mass of the metal plate was adjusted so that the load was 100 gf (0.98 N) when the probe was pressed against the test piece. Then, 60 seconds after the probe was pressed against the test piece, the probe was lowered at a speed of 600 mm/min, and the peak load at the time of peeling from the test piece was measured. The results are indicated in Table 1.

(Confirmation of Presence or Absence of Deposits on Side Surface of Silicon Chip)

The obtained first protective film forming sheet was attached to a silicon wafer with a diameter of 8 inches by using an attaching device ("RAD-3510 F/12" manufactured by Lintec Corporation), under the conditions of a table temperature of 70° C., an attaching speed of 2 mm/sec, and an attaching pressure of 0.5 MPa.

Next, the surface on the side opposite to the attachment surface of the first protective film forming sheet of the silicon wafer was ground by using a polishing device ("DGP-8760" manufactured by DISCO Corporation) until the thickness of the silicon wafer reached 200 μm.

A layer (that is, the first supporting sheet) other than the thermosetting resin film of the attached first protective film forming sheet was removed, and the stacked body of the thermosetting resin film and the silicon wafer was heated at 130° C. for two hours in an oven so as to thermally curing the thermosetting resin film, thereby forming the first protective film.

Subsequently, a dicing tape ("D-675" manufactured by Lintec Corporation) was attached to the surface (that is, polished surface) of the silicon wafer on the side opposite to the surface on which the first protective film was formed by using the attaching device ("RAD-2700 F/12" manufactured by Lintec Corporation). Then, the silicon wafer with the first protective film was diced into individual pieces under the following conditions so as to obtain a silicon chip with a first protective film with a size of 8 mm×8 mm.

As described above, it took one day to obtain the silicon chip with the first protective film from the attachment of the first protective film forming sheet.

Dicing Conditions

Dicing Apparatus: "DFD 6361" manufactured by DISCO Corporation

Dicing blade: ZH05-5133000-1-90-DD (thickness of 30 to 35 μm)

Feed Speed of dicing blade: 50 mm/sec

Number of revolutions of dicing blade: 20,000 rpm

Cutting position by dicing blade: 15 μm from base material surface of dicing tape The dicing tape after dicing was irradiated with ultraviolet rays and the silicon chip with the first protective film was picked up. Further, five picked-up silicon chips were selected and four side surfaces of these silicon chips were observed using a digital microscope ("VHX-1000" manufactured by Keyence Corporation) so as to confirm the presence or absence of deposits generated at the time of dicing. The results are indicated in Table 1.

<Manufacturing of First Protective Film Forming Sheet and Evaluation of Cured Material of Thermosetting Resin Film>

Example 2

A first protective film forming sheet was manufactured in the same method as that used in Example 1 except that the contained component and the amount of the thermosetting resin layer forming composition were set as indicated in Table 1, and a cured material of the thermosetting resin film was evaluated. The results are indicated in Table 1.

<Manufacturing of First Protective Film Forming Sheet and Evaluation of Thermosetting Resin Film>

Reference Example 1

The first protective film forming sheet was manufactured by using the same method as that used in Example 1.

Next, evaluation was performed in the same method as that used in Example 1 except that the heat treatment of the thermosetting resin film was not performed at 130° C. for two hours. That is, in the present reference examples, measuring the Young's modulus, measuring the tack peak load, and confirmation of the deposits at the time of dicing was performed with respect to a non-cured material, without thermally curing the thermosetting resin film. The results are indicated in Table 1.

TABLE 1

| | | | Example 1 | Example 2 | Reference Example 1 |
|---|---|---|---|---|---|
| Contained component (amount (parts by mass)) of thermosetting resin layer forming composition | Polymer component | (A)-1 | 100 | — | 100 |
| | | (A)-2 | — | 100 | — |
| | Epoxy resin | (B1)-1 | 135 | — | 135 |
| | | (B1)-2 | 90 | — | 90 |
| | | (B1)-3 | 150 | — | 150 |
| | | (B1)-4 | — | 12 | — |
| | Thermal curing agent | (B2)-1 | 180 | 9 | 180 |
| | Curing accelerator | (C)-1 | 1 | 0.08 | 1 |
| | Filler | (D)-1 | 160 | 20 | 160 |
| Heating of thermosetting resin layer forming composition | | | Present (130° C. for two hours) | Present (130° C. for two hours) | None |
| Evaluation results | Young's modulus (MPa) | | 5,000 | 10 | 0.01 |
| | Peak value of load measured by probe tack test (g) | | 0 | 10 | 600 |
| | Deposits on exposed surface of silicon chip | | None | None | Present |

As apparent from the above results, in Examples 1 and 2, the Young's modulus of the cured material of the thermosetting resin film which can be used as the first protective film at the time of dicing was within a specific range of 10 to 5,000 MPa, and the tack peak load of the cured material was in a specific range of 0 to 10 g. As a result, in Examples 1 and 2, the deposits such as cutting wastes derived from the first protective film, which were generated at the time of dicing, were not observed at all on the side surface of the five silicon chips.

In contrast, in Reference Example 1, the Young's modulus of the thermosetting resin film was excessively small, and the tack peak load was excessively large, and thereby the cutting wastes derived from the first protective film, which were generated at the time of dicing were attached to the side surface of all of the five silicon chips.

INDUSTRIAL APPLICABILITY

The present invention can be used for manufacturing a semiconductor chip or the like having bumps at a connection pad portion used in a flip chip mounting method.

REFERENCE SIGNS LIST 1, 2, 3 . . . FIRST PROTECTIVE FILM FORMING SHEET,
11 . . . FIRST BASE MATERIAL,
11a . . . SURFACE OF FIRST BASE MATERIAL,
12 . . . CURABLE RESIN LAYER (CURABLE RESIN FILM),
12' . . . FIRST PROTECTIVE FILM,
13 . . . FIRST PRESSURE-SENSITIVE ADHESIVE LAYER,
13a . . . SURFACE OF FIRST PRESSURE-SENSITIVE ADHESIVE LAYER,
14 . . . FIRST INTERLAYER,
101, 102, 103 . . . FIRST SUPPORTING SHEET,
101a, 102a, 103a . . . SURFACE OF FIRST SUPPORTING SHEET,
90 . . . SEMICONDUCTOR WAFER,
90a . . . CIRCUIT SURFACE OF SEMICONDUCTOR WAFER,
90' . . . SEMICONDUCTOR CHIP,
90a' . . . CIRCUIT SURFACE OF SEMICONDUCTOR CHIP,
91 . . . BUMP,
91a . . . SURFACE OF BUMP

What is claimed is:

1. A method for forming a protection film, the method comprising:
attaching a curable resin film on a circuit surface of a semiconductor wafer, the circuit surface having convex electrodes, the curable resin film comprising a polymer component and a thermosetting component, the thermosetting component comprising an epoxy resin and a thermal curing agent, an amount of the thermosetting component being 150 to 800 parts by mass with respect to 100 parts by mass of the polymer component, the curable resin film being substantially flat along an entire extent thereof, from a first end of the circuit surface to a second end, opposite the first end;
to reveal a top surface of the convex electrode and to cover a portion of the convex electrodes other than the top surfaces of the convex electrodes and a vicinity of the top surfaces in the absence of a mold; and
curing the curable resin film to form the protection film with a Young's modulus of equal to or greater than 0.02 MPa and a peak value of a load measured by a probe tack test at 80° C. of equal to or less than 500 g.

2. The method for forming the protection film according to claim 1, wherein curing the curable resin film is performed by heating the curable resin film.

3. A method for manufacturing a semiconductor chip with convex electrodes and a protection film, the method comprising:
forming the protection film according to claim 1; and
dicing the semiconductor wafer and the protection film to form the semiconductor chip.

4. The method for manufacturing the semiconductor device according to claim 3, further comprising:
grinding a surface opposite to the circuit surface of the semiconductor wafer after heating the curable resin and before curing the curable resin.

5. The method for manufacturing the semiconductor device according to claim 3, wherein
curing the curable resin film is performed by heating the curable resin film.

6. The method for forming the protection film according to claim 1, wherein
the polymer component is at least one polymer component selected from the group consisting of acrylic resins, polyesters, urethane-based resins, acrylic urethane resins, silicone-based resins, rubber-based resins, phenoxy resins, and thermosetting polyimides.

7. The method for forming the protection film according to claim 1, wherein
the epoxy resin is at least one epoxy resin selected from the group consisting of polyfunctional epoxy resins, biphenyl compounds, bisphenol A diglycidyl ethers, hydrogenated substances of bisphenol A diglycidyl ethers, orthocresol novolac epoxy resins, dicyclopentadiene-type epoxy resins, biphenyl-type epoxy resins, bisphenol A-type epoxy resins, bisphenol F-type epoxy resins, and phenylene skeleton-type epoxy resins.

8. The method for forming the protection film according to claim 1, wherein
the curable resin film further comprises 7% to 60% by mass of an inorganic filler with respect to the total amount of the curable resin film.

9. The method for forming the protection film according to claim 1, further comprising:
removing a first supporting sheet over the curable resin film after curing the curable resin film.

10. The method for forming the protection film according to claim 9, wherein
a first interlayer is formed between the first supporting sheet and the curable resin film.

11. The method for forming the protection film according to claim 1, wherein a portion of the circuit surface of the semiconductor wafer in contact with the protection film is substantially flat from a first lateral side to a second lateral side, opposite the first lateral side.

12. The method for forming the protection film according to claim 11, wherein the circuit surface is substantially free of grooves.

13. The method for forming the protection film according to claim 1, wherein the curing the curable resin film is carried out exclusively by heat treatment, and the heat treatment is performed in an oven.

14. The method for forming the protection film according to claim 1, wherein the electrode has a part-spherical shape, with a substantially flat bottom surface of the electrode in contact with the circuit surface defining a chord of the part-spherical shape.

15. The method for forming the protection film according to claim 1, wherein the circuit surface is substantially free of grooves.

16. A method for forming a protection film, the method comprising:
attaching a curable resin film on a circuit surface of a semiconductor wafer, the circuit surface having convex electrodes, the curable resin film comprising a polymer component and a thermosetting component, the thermosetting component comprising an epoxy resin and a thermal curing agent, an amount of the thermosetting component being 150 to 800 parts by mass with respect to 100 parts by mass of the polymer component;
to reveal a top surface of the convex electrode and to cover a portion of the convex electrodes other than the top surfaces of the convex electrodes and a vicinity of the top surfaces in the absence of a mold; and
curing the curable resin film to form the protection film with a Young's modulus of equal to or greater than 0.02 MPa and a peak value of a load measured by a probe tack test at 80° C. of equal to or less than 500 g,
wherein the curing of the curable resin film is carried out in the absence of a mold.

17. The method for forming the protection film according to claim 1, wherein the curing is carried out subsequent to the heating.

* * * * *